(12) United States Patent
Wang et al.

(10) Patent No.: US 12,506,056 B2
(45) Date of Patent: Dec. 23, 2025

(54) ELECTRONIC PACKAGE STRUCTURE AND MANUFACTURING METHOD THEREOF

(71) Applicant: Unimicron Technology Corp., Taoyuan (TW)

(72) Inventors: Chin-Sheng Wang, Taoyuan (TW); Ra-Min Tain, Hsinchu County (TW); Wen-Yu Lin, Taichung (TW); Tse-Wei Wang, Hsinchu (TW); Jun-Ho Chen, Taoyuan (TW); Guang-Hwa Ma, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 659 days.

(21) Appl. No.: 17/902,902

(22) Filed: Sep. 5, 2022

(65) Prior Publication Data

US 2023/0268257 A1    Aug. 24, 2023

Related U.S. Application Data

(60) Provisional application No. 63/312,102, filed on Feb. 21, 2022.

(30) Foreign Application Priority Data

Jul. 25, 2022  (TW) .................................. 111127679

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/4857* (2013.01);
(Continued)

(58) Field of Classification Search
CPC ..... H01L 2223/6622; H01L 2223/6677; H01L 21/4857; H01L 21/486; H01L 23/49822;
(Continued)

(56) References Cited

U.S. PATENT DOCUMENTS

| RE45,146 E | 9/2014 | Miyazaki et al. |
| 2002/0102835 A1* | 8/2002 | Stucchi ............... H01L 23/5225 257/E23.152 |

(Continued)

FOREIGN PATENT DOCUMENTS

| CN | 100435604 | 11/2008 |
| TW | 201539717 | 10/2015 |

(Continued)

OTHER PUBLICATIONS

"Office Action of Taiwan Related Application, Application No. 112114199", issued on Feb. 19, 2024, p. 1-p. 7.

*Primary Examiner* — Victor A Mandala
(74) *Attorney, Agent, or Firm* — JCIPRNET

(57) ABSTRACT

An electronic package structure and its manufacturing method are provided. The electronic package structure includes an interposer, a circuit board, a chip, and a circuit structure. The interposer includes an interposer substrate and a coaxial conductive element located in the interposer substrate. The interposer substrate includes a cavity. The coaxial conductive element includes a first conductive structure, a second conductive structure surrounding the first conductive structure, and a first insulation structure. The first insulation structure is disposed between the first and second conductive structures. The circuit board is disposed on a lower surface of the interposer substrate and electrically connected to the coaxial conductive element. The chip is disposed in the cavity and located on the circuit board, so as to be electrically connected to the circuit board. The circuit structure is (Continued)

disposed on an upper surface of the interposer substrate and electrically connected to the coaxial conductive element.

19 Claims, 26 Drawing Sheets

(51) Int. Cl.
  *H01L 23/66* (2006.01)
  *H01Q 1/38* (2006.01)
  *H01L 23/00* (2006.01)

(52) U.S. Cl.
  CPC ...... *H01L 21/486* (2013.01); *H01L 23/49822* (2013.01); *H01L 23/49833* (2013.01); *H01L 23/66* (2013.01); *H01Q 1/38* (2013.01); *H01L 24/16* (2013.01); *H01L 24/32* (2013.01); *H01L 24/73* (2013.01); *H01L 2223/6622* (2013.01); *H01L 2223/6677* (2013.01); *H01L 2224/16227* (2013.01); *H01L 2224/32225* (2013.01); *H01L 2224/73253* (2013.01); *H01L 2924/2027* (2013.01); *H01L 2924/3025* (2013.01)

(58) Field of Classification Search
  CPC ............. H01L 23/49833; H01L 23/142; H01L 23/49827; H01L 23/49861; H01L 23/4985; H01L 23/66; H01L 23/49811; H01L 23/4853; H01L 23/486; H01L 2924/2027; H01L 24/27; H01L 24/04; H01L 24/07; H01L 24/03; H01L 24/50; H01L 24/73; H01L 24/79; H01L 24/80; H01L 24/81; H01L 24/82; H01L 24/83; H01L 24/84; H01L 24/85; H01L 24/86; H01L 24/89; H01L 24/92; H01L 24/91; H01L 24/90; H01L 24/98; H01L 2224/50; H01L 2224/01; H01L 2224/64; H01L 2224/79; H01L 2224/81095; H01L 2224/81097; H01L 2224/81099; H01L 2224/81053; H01Q 21/065; H01Q 9/0407; H01Q 1/2283; H01Q 1/38
  See application file for complete search history.

(56) References Cited

U.S. PATENT DOCUMENTS

| | | | |
|---|---|---|---|
| 2013/0048361 A1* | 2/2013 | Yamashita | H01L 23/49822 174/260 |
| 2015/0130046 A1* | 5/2015 | Lin | H01L 23/5389 438/122 |
| 2016/0172292 A1* | 6/2016 | Hsu | H01L 23/49833 257/698 |
| 2017/0040255 A1* | 2/2017 | Lee | H01L 23/498 |
| 2022/0071009 A1* | 3/2022 | LeClair | H01L 23/15 |
| 2022/0352110 A1* | 11/2022 | Yim | H01L 23/49838 |

FOREIGN PATENT DOCUMENTS

| | | |
|---|---|---|
| TW | 702755 | 8/2020 |
| TW | 202032679 | 9/2020 |

\* cited by examiner

ELECTRONIC PACKAGE STRUCTURE AND MANUFACTURING METHOD THEREOF

CROSS-REFERENCE TO RELATED APPLICATION

This application claims the priority benefit of U.S. provisional application Ser. No. 63/312,102, filed on Feb. 21, 2022, and Taiwan application serial no. 111127679, filed on Jul. 25, 2022. The entirety of each of the above-mentioned patent applications is hereby incorporated by reference herein and made a part of this specification.

BACKGROUND

Technical Field

The disclosure relates to a package structure and a manufacturing method thereof, and more particularly to an electronic package structure and a manufacturing method thereof.

Description of Related Art

With the advancement of science and technology, functions of electron products are becoming more and more abundant, and the integration of antenna structures and chip package structures is conducive to satisfying the requirements for miniaturization and light weight of the electronic products. Generally, in the existing chip package structure having the antenna structure, a chip is usually disposed on a circuit board, and a film sealing material covers the chip to form the chip package structure. The antenna structure is disposed on the chip package structure, and the antenna structure and the circuit board are electrically connected through a conductive pillar or a conductive ball that penetrates the film sealing material in the chip package structure. However, the above-mentioned package structure has a relatively large volume and cannot effectively prevent loss of radio frequency signals during the signal transmission process.

SUMMARY

The disclosure provides an electronic package structure and a manufacturing method thereof, which may reduce signal loss and may be conducive to miniaturization of the electronic package structure.

According to an embodiment of the disclosure, an electronic package structure including an interposer, a circuit board, a chip, and a circuit structure is provided. The interposer includes an interposer substrate and a coaxial conductive element. The interposer substrate has an upper surface and a lower surface opposite to the upper surface, where the interposer substrate includes a cavity. The coaxial conductive element is located in the interposer substrate. The coaxial conductive element includes a first conductive structure, a second conductive structure, and a first insulation structure. The second conductive structure surrounds the first conductive structure. The first insulation structure is disposed between the first conductive structure and the second conductive structure. The circuit board is disposed on the lower surface of the interposer substrate and electrically connected to the coaxial conductive element. The chip is disposed in the cavity and located on the circuit board, so as to be electrically connected to the circuit board. The circuit structure is disposed on the upper surface of the interposer substrate and electrically connected to the coaxial conductive element.

In an embodiment of the disclosure, a material of the interposer substrate includes a conductive material.

In an embodiment of the disclosure, the electronic package structure further includes a thermal interface material that is disposed on a back surface of the chip and is in contact with the interposer substrate.

In an embodiment of the disclosure, the circuit structure includes a first core layer, a first antenna layer, a second antenna layer, and a plurality of pads. The first core layer has a first surface and a second surface opposite to the first surface, where the second surface faces the interposer. The first antenna layer is disposed on the first surface. The second antenna layer is disposed on the second surface. The pads are disposed on the second surface and corresponds to the coaxial conductive element.

In an embodiment of the disclosure, the pads include a first pad and a second pad. The first pad corresponds to the first conductive structure of the coaxial conductive element. The second pad corresponds to the second conductive structure of the coaxial conductive element, where the second pad has a ring shape.

In an embodiment of the disclosure, the pads include a first pad and a plurality of second pads. The first pad corresponds to the first conductive structure of the coaxial conductive element. The second pads correspond to the second conductive structure of the coaxial conductive element, where the second pads surround the first pad.

In an embodiment of the disclosure, the electronic package structure further includes a first conductive connection element that is disposed between the pads of the circuit structure and the coaxial conductive element.

In an embodiment of the disclosure, the electronic package structure further includes a first adhesion layer that is disposed between the interposer and the circuit structure.

In an embodiment of the disclosure, the circuit board includes the pads corresponding to the coaxial conductive element, and the electronic package structure further includes a second conductive connection element that is disposed between the circuit board and the coaxial conductive element.

In an embodiment of the disclosure, the first conductive structure of the coaxial conductive element is adapted to transmit a signal, and the second conductive structure is adapted to be grounded or connected to a power source.

According to an embodiment of the disclosure, a manufacturing method of an electronic package structure includes steps as follows. A circuit board is provided. A chip is placed on the circuit board. An interposer is provided, and the interposer includes an interposer substrate and a coaxial conductive element. The interposer substrate has an upper surface and a lower surface opposite to the upper surface, and the interposer substrate includes a cavity. The coaxial conductive element is located in the interposer substrate and includes a first conductive structure, a second conductive structure, and a first insulation structure. The second conductive structure surrounds the first conductive structure. The first insulation structure is disposed between the first conductive structure and the second conductive structure. A circuit structure is provided, and the circuit structure is laminated onto the upper surface of the interposer substrate at a first temperature. The cavity is formed on the lower surface of the interposer substrate. The circuit board is bonded onto the lower surface of the interposer substrate at a second temperature, and the chip is placed in the cavity.

In an embodiment of the disclosure, the step of providing the interposer includes the following. A core substrate is provided, and the core substrate has a first side and a second side opposite to the first side. A first through hole is formed in the core substrate. The first through hole is filled with an insulation material. A second through hole is formed in the insulation material to form the first insulation structure. A first conductive material layer is formed on the first side and the second side of the core substrate and in the second through hole. The first conductive material layer is patterned to expose a portion of the first insulation structure.

In an embodiment of the disclosure, an aperture of the first through hole ranges from 250 µm to 450 µm, and an aperture of the second through hole ranges from 50 µm to 100 µm.

In an embodiment of the disclosure, the step of providing the interposer includes the following. A core substrate is provided, and the core substrate has a first side and a second side opposite to the first side. A ring-shaped groove is formed on the first side of the core substrate, where the ring-shaped groove does not penetrate the second side of the core substrate. The ring-shaped groove is filled with an insulation material to form the first insulation structure. A portion of the core substrate is removed from the second side of the core substrate until the first insulation structure is exposed. A first conductive material layer is formed on the first side and the second side of the core substrate. The first conductive material layer is patterned to expose a portion of the first insulation structure.

In an embodiment of the disclosure, the manufacturing method further includes the following. A first adhesive material layer is formed on the upper surface of the interposer substrate, where the first adhesive material layer is in a semi-curing state. A plurality of vias are formed in the first adhesive material layer to expose a portion of the coaxial conductive element. A first conductive connection material is formed in the vias.

In an embodiment of the disclosure, the first conductive connection material comprises a copper glue, a silver glue, or a transient liquid phase sintering (TLPS) glue.

In an embodiment of the disclosure, the step of laminating the circuit structure onto the upper surface of the interposer substrate includes the following. At the first temperature, the circuit structure and the interposer substrate are laminated, so that a plurality of pads of the circuit structure are correspondingly connected to the first conductive connection material, and the first adhesive material layer is cured.

In an embodiment of the disclosure, the step of bonding the circuit board onto the lower surface of the interposer substrate includes the following. A solder mask is formed on the lower surface of the interposer substrate, where the solder mask includes a plurality of vias to expose a portion of the coaxial conductive element. A second conductive connection material is formed in the vias. The coaxial conductive element and a plurality of pads of and the circuit board are correspondingly bonded through the second conductive connection material.

In an embodiment of the disclosure, the second conductive connection material includes a solder paste or a solder ball.

In an embodiment of the disclosure, the first temperature ranges from 180° C. to 220° C., and the second temperature ranges from 250° C. to 270° C.

In view of the above, in the electronic package structure provided in one or more embodiments of the disclosure, the circuit board, the interposer, and the circuit structure may be integrated into one package structure, and the chip is disposed in the cavity of the interposer, so as to effectively utilize the space, which is further conducive to miniaturization of the electronic package structure. Besides, the interposer is made of the conductive material, whereby the heat dissipation capacity of the chip is improved. Moreover, the interposer includes the coaxial conductive element that is configured to electrically connect the circuit structure and the circuit board, so as to reduce loss of radio frequency signals received by or sent from the circuit structure during the signal transmission and shield electromagnetic interference (EMI) signals. As such, signal integrity may be enhanced.

In order to make the above-mentioned features and advantages of the disclosure comprehensible, embodiments accompanied with drawings are described in detail below.

BRIEF DESCRIPTION OF THE DRAWINGS

The accompanying drawings, which are included to provide a further understanding of the disclosure, are incorporated in and constitute a part of this specification. The drawings illustrate embodiments of the disclosure and, together with the description, serve to explain the principles of the disclosure.

DESCRIPTION OF THE EMBODIMENTS

Figure 1:
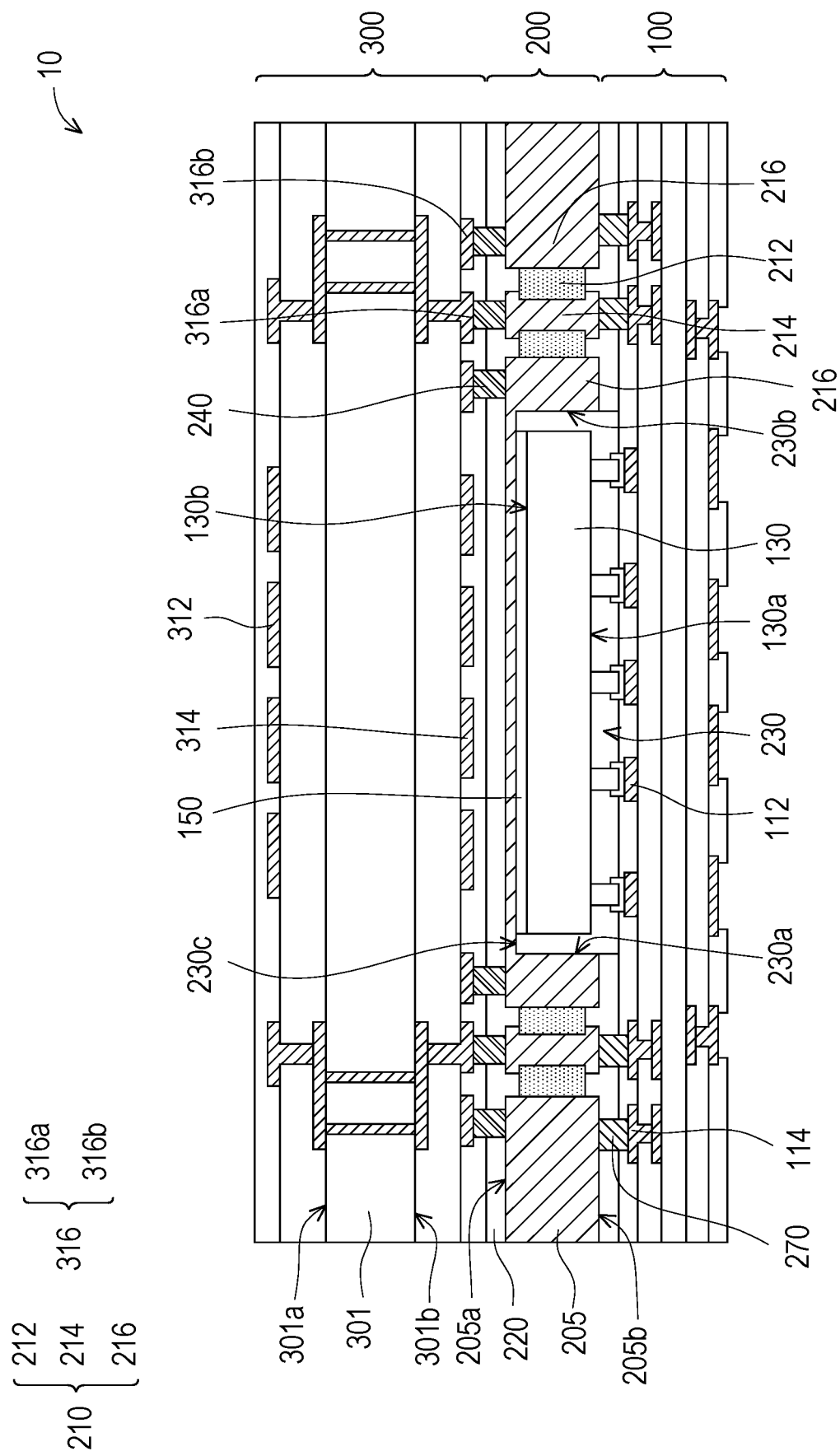
FIG. 1 is a schematic cross-sectional view illustrating an electronic package structure according to an embodiment of the disclosure.

The disclosure will be understood by reference to the following detailed description when considered in connection with the accompanying drawings. It is to be noted that, for ease of understanding and simplicity of the drawings, some of the drawings of the disclosure only illustrate a part of an electronic device, and specific components in the drawings are not drawn according to actual scale. In addition, the number and size of each component in the drawings are only for schematic purposes and are not intended to limit the scope of the disclosure.

In the following description and claims, the terminologies such as "include," "comprise," and "have/has" are used in an open-ended fashion and thus should be interpreted to mean "including but not limited to . . . ".

It should be understood that, although the terminologies "first," "second," "third," and so forth may serve to describe various elements, components, regions, layers, and/or sections in this disclosure, these elements, components, regions, layers, and/or sections shall not be limited by these terminologies. These terminologies merely serve to distinguish one element, component, region, layer, and/or section from another element, component, region, layer, or section. Thus, a first "element," "component," "region," "layer," or "section" discussed below may be called as a second element, component, region, layer, or section without departing from the teachings herein.

In this disclosure, directional terminologies, such as "top," "bottom," "front," "back," and so on, are used with reference to the orientation of the accompanying drawings. As such, the directional terminologies are used for purposes of illustration and are in no way limiting.

In the accompanying drawings, each drawing shows the general features of the methods, structures and/or materials adopted in a specific embodiment. However, the drawings should not be construed as defining or limiting the scope or nature covered by the embodiments. For instance, for clarity, the relative size, thickness, and position of each layer, region, and/or structure may be reduced or enlarged.

In the following embodiments, the same or similar devices will be denoted by the same or similar reference numbers, and repeated descriptions thereof will be omitted. In addition, the features in different embodiments may be combined if no issue of conflict results therefrom, and simple equivalent changes and modifications made according to the specification or the claims still fall within the scope provided in the disclosure.

Figure 2:
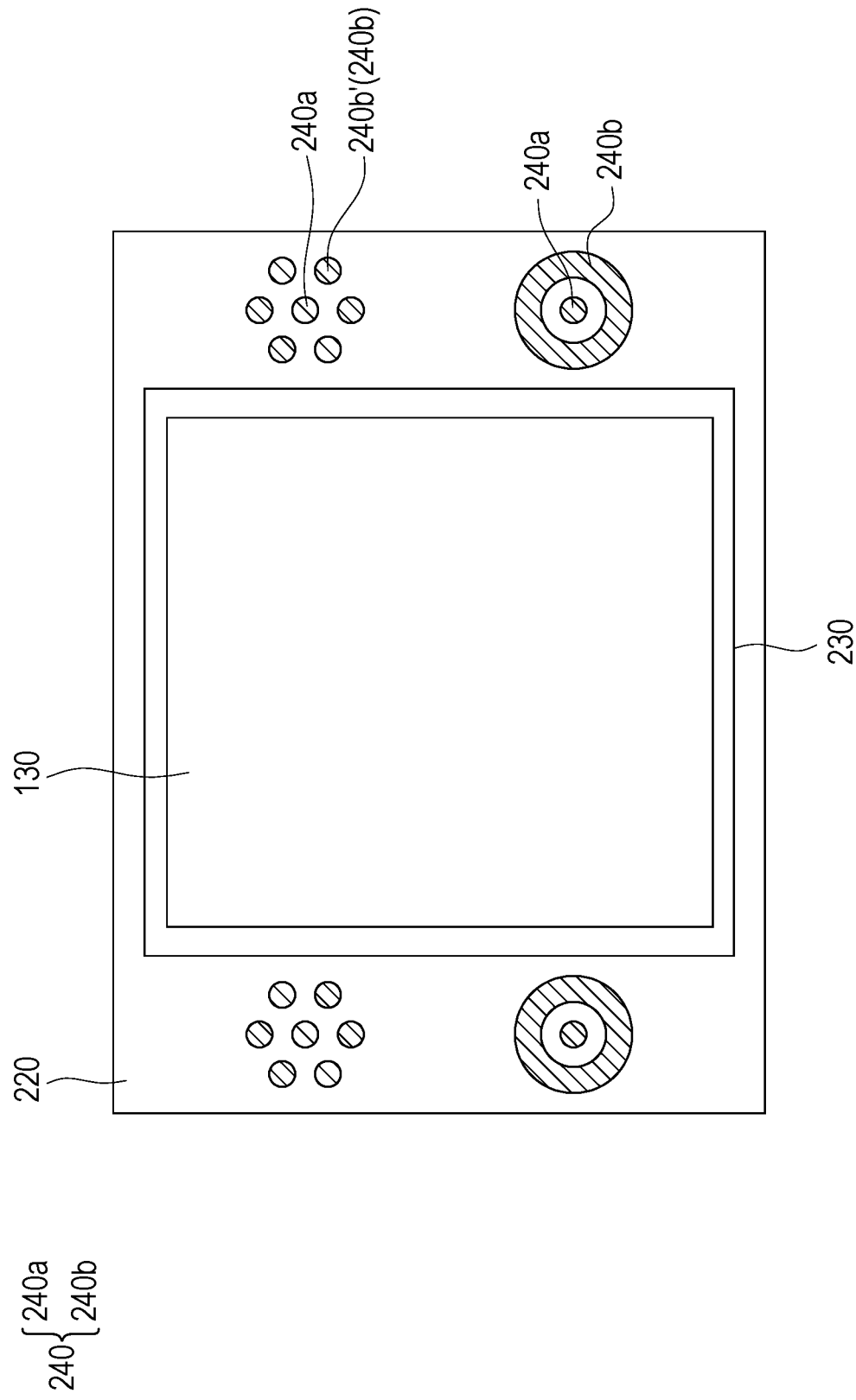
FIG. 2 is a schematic top view illustrating the electronic package structure depicted in FIG. 1.

FIG. 1 is a schematic cross-sectional view illustrating an electronic package structure according to an embodiment of the disclosure. FIG. 2 is a schematic top view illustrating the electronic package structure depicted in FIG. 1. For clear illustration, a chip 130, a first conductive connection element 240, and a first adhesion layer 220 are depicted in FIG. 2, while the other components are omitted. The omitted components may be referred to those depicted in FIG. 1.

With reference to FIG. 1 and FIG. 2, an electronic package structure 10 includes a circuit board 100, an interposer 200, the chip 130, and a circuit structure 300. The interposer 200 includes an interposer substrate 205 and a coaxial conductive element 210. The interposer substrate 205 has an upper surface 205a and a lower surface 205b opposite to the upper surface 205a, and the interposer substrate 205 includes a cavity 230. The coaxial conductive element 210 is located in the interposer substrate 205. The coaxial conductive element 210 includes a first conductive structure 214, a second conductive structure 216, and a first insulation structure 212. The second conductive structure 216 surrounds the first conductive structure 214. The first insulation structure 212 is disposed between the first conductive structure 214 and the second conductive structure 216. The circuit board 100 is disposed on the lower surface 205b of the interposer substrate 205 and electrically connected to the coaxial conductive element 210. The chip 130 is disposed in the cavity 230 and located on the circuit board 100, so as to be electrically connected to the circuit board 100. The circuit structure 300 is disposed on an upper surface 205a of the interposer substrate 205 and electrically connected to the coaxial conductive element 210.

Since the chip 130 may be disposed in the cavity 230 of the interposer 200, space may be effectively utilized, and the volume of the electronic package structure 10 may be reduced. Besides, the interposer 200 includes the coaxial conductive element 210 that is configured to electrically connect the circuit structure 300 and the circuit board 100, so as to reduce loss of radio frequency signals received by or sent from the circuit structure 300 during the signal transmission and shield electromagnetic interference (EMI) signals. As such, signal integrity may be enhanced.

In some embodiments, a material of the interposer substrate 205 may be a conductive material, preferably an electrically conductive and thermally conductive material, such as copper, aluminum, other appropriate metal materials, or alloys of the above-mentioned materials. As such, the coaxial conductive element 210 may be constituted by a portion of the interposer substrate 205, and the interposer substrate 205 is capable of heat dissipation.

In some embodiments, the cavity 230 is a recess recessed from the lower surface 205b to the upper surface 205a, and the cavity 230 may be constituted by sidewalls 230a and 230b and a bottom surface 230c of the interposer substrate 205. That is, the cavity 230 does not penetrate the interposer substrate 205, which should however not be construed as a limitation in the disclosure. In other embodiments, the cavity 230 may penetrate the interposer substrate 205.

In some embodiments, the dimension (e.g., the length, the width, and the height) of the cavity 230 is at least greater than the dimension of the chip 130, so that the chip 130 may be accommodated in the cavity 230.

In some embodiments, a circuit structure 300 includes a first core layer 301, a first antenna layer 312, a second antenna layer 314, and a plurality of pads 316. The first core layer 301 has a first surface 301a and a second surface 301b opposite to the first surface 301a, where the second surface 301b faces the interposer 200. The first antenna layer 312 is disposed on the first surface 301a. The second antenna layer 314 and the pads 316 are disposed on the second surface 301b. The pads 316 may include a first pad 316a and a plurality of second pads 316b. The first pad 316a corresponds to the first conductive structure 214 of the coaxial conductive element 210, and the second pads 316b correspond to the second conductive structure 216 of the coaxial conductive element 210.

In some embodiments, the first conductive connection element 240 may be disposed between the coaxial conductive element 210 and the pads 316 of the circuit structure 300, so that the pads 316 and the coaxial conductive element 210 are electrically connected. In some embodiments, a material of the first conductive connection element 240 may include copper, silver, copper alloy, copper-tin alloy, tin-bismuth alloy, or other appropriate materials, which should not be construed as a limitation in the disclosure.

Figure 9A:
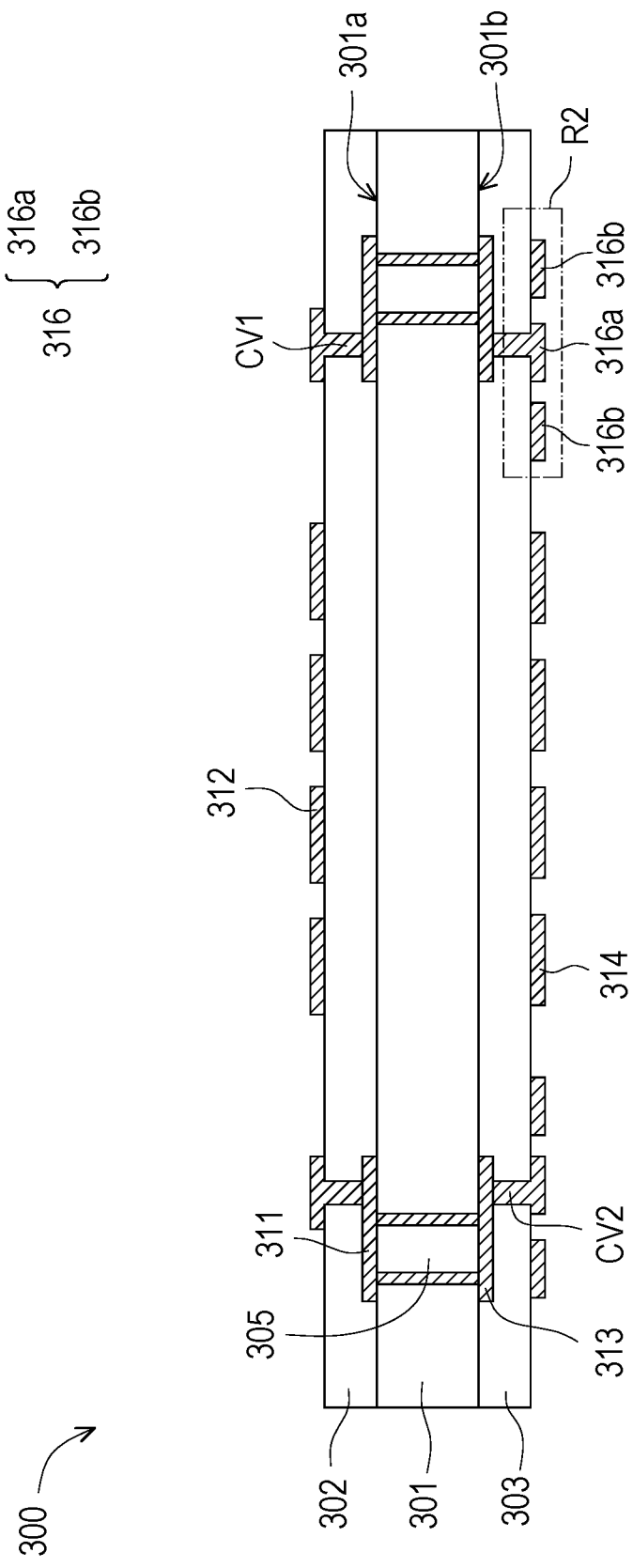
FIG. 9A to FIG. 9C are schematic views illustrating a circuit structure according to an embodiment of the disclosure.
Figure 9C:
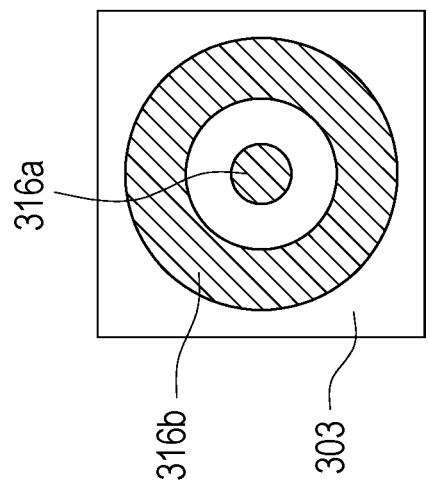
Figure 9B:
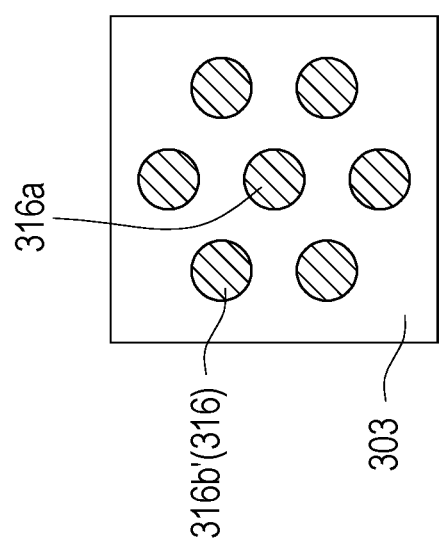

In some embodiments, as shown by the top view in FIG. 2, an alignment pattern of the first conductive connection element 240 corresponding to the coaxial conductive element 210 may correspond to the alignment of the pads 316 of the circuit structure 300 (as illustrated in FIG. 9B and FIG. 9C and described in the relevant paragraphs hereafter). That is, the first conductive connection element 240 may include an intermediate conductive connection element 240a corresponding to the first pad 316a and a peripheral conductive connection element 240b corresponding to the second pads 316b. In some embodiments, the second pads 316b are ring-shaped pads, and thus the peripheral conductive connection element 240b may correspondingly have a ring shape and surround the intermediate conductive connection element 240a. In other embodiments, the second pads 316b includes a plurality of pads surrounding the first pad 316a, and thus the peripheral conductive connection element 240b may be correspondingly a plurality of peripheral conductive connection elements 240b' and may surround the intermediate conductive connection element 240a.

Although FIG. 2 shows that the electronic package structure 10 includes two alignment patterns of the first conductive connection element 240 corresponding to the coaxial conductive element 210, it is not intended to pose any limitation in the disclosure. The first conductive connection element 240 of the electronic package structure 10 may include one or more alignment patterns corresponding to the coaxial conductive element 210.

In some embodiments, the coaxial conductive element 210 may be disposed around the chip 130, which should however not be construed as a limitation in the disclosure. Although FIG. 1 and FIG. 2 show that the coaxial conductive element 210 is symmetrically disposed on both sides of the chip 130, it is not intended to pose any limitation in the disclosure, and the location and the quantity of the coaxial conductive element 210 may be adjusted according to actual demands.

In some embodiments, the electronic package structure 10 further includes the first adhesion layer 220. The first adhesion layer 220 is disposed between the interposer 200 and the circuit structure 300 to facilitate the bonding between the interposer 200 and the circuit structure 300.

In some embodiments, the circuit board 100 may be a printed circuit board (PCB), a flexible printed circuit board (FPC), or any other appropriate circuit board. For instance, the circuit board 100 includes a plurality of alternately stacked insulation layers and circuit layers (which is elaborated hereinafter with reference to FIG. 4A). In some embodiments, the circuit board 100 includes pads 112 corresponding to the chip 130 and pads 114 corresponding to the coaxial conductive element 210.

In some embodiments, the chip 130 has an active surface 130a and a back surface 130b opposite to the active surface 130a. The active surface 130a of the chip 130 faces the circuit board 100 and is electrically connected to the circuit board 100.

In some embodiments, the electronic package structure 10 further includes a thermal interface material 150 that is disposed on the back surface 130b of the chip 130 and in contact with the bottom surface 230c of the cavity 230. As such, the chip 130 may dissipate the heat through the thermal interface material 150 and further conduct the heat to the interposer substrate 205, so that the heat dissipation capability of the electronic package structure 10 may be improved.

In some embodiments, the electronic package structure 10 further includes a second conductive connection element 270, which may be disposed between the circuit board 100 and the coaxial conductive element 210. For instance, the second conductive connection element 270 may be disposed between the pads 114 of the circuit board 100 and the coaxial conductive element 210, so that the pads 114 and the coaxial conductive element 210 are electrically connected. In some embodiments, a material of the second conductive connection element 270 may include tin, copper-tin alloy, lead-free alloy, or other appropriate materials, which should not be construed as a limitation in the disclosure.

In some embodiments, the first conductive structure 214 of the coaxial conductive element 210 is adapted to transmit signals, and the second conductive structure 216 is adapted to be grounded or connected to a power source. That is, the pads 114 of the circuit board 100 corresponding to the first conductive structure 214 may be signal pads, and the pads 114 of the circuit board 100 corresponding to the second conductive structure 216 may be ground pads or power pads.

Figure 3:
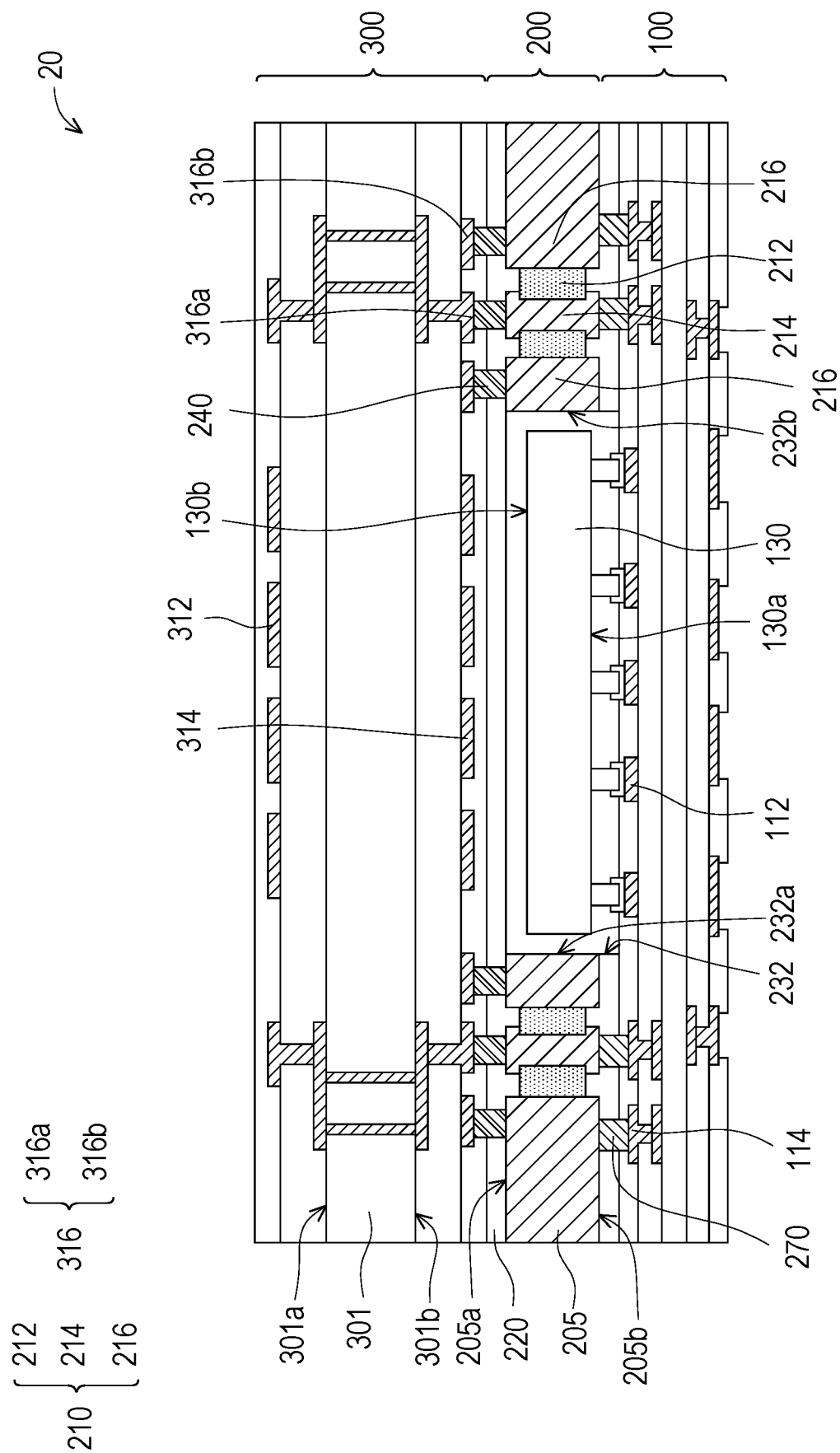
FIG. 3 is a schematic cross-sectional view illustrating an electronic package structure according to another embodiment of the disclosure.

FIG. 3 is a schematic cross-sectional view illustrating an electronic package structure according to another embodiment of the disclosure. Note that the reference numbers and some content provided in the embodiment shown in FIG. 1 are also applied in the embodiment depicted in FIG. 3, where the same or similar reference numbers are used to represent the same or similar element, and the description of the same technical content is omitted. The description of the omitted content may be referred to as that provided in the previous embodiment and will not be repeated hereinafter.

With reference to FIG. 3, the difference between an electronic package structure 20 depicted in FIG. 3 and the electronic package structure 10 depicted in FIG. 1 lies in that the interposer substrate 205 of the electronic package structure 20 includes a cavity 232, and the cavity 232 penetrates the interposer substrate 205. That is, the cavity 232 is constituted by sidewalls 232a and 232b of the interposer substrate 205 but does not have any bottom surface, and thus the cavity 232 may expose a surface of the first adhesion layer 220.

In this embodiment, no thermal interface material is disposed on the back surface 130b of the chip 130, which should however not be construed as a limitation in the disclosure, and the thermal interface material may be disposed according to actual demands.

Figure 4A:
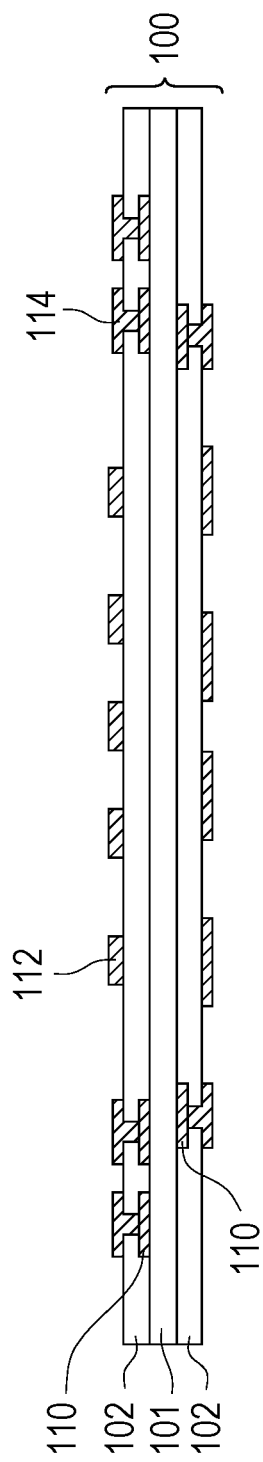
FIG. 4A to FIG. 4C are schematic cross-sectional views illustrating a manufacturing process of a chip disposed on a circuit board according to an embodiment of the disclosure.
Figure 4B:
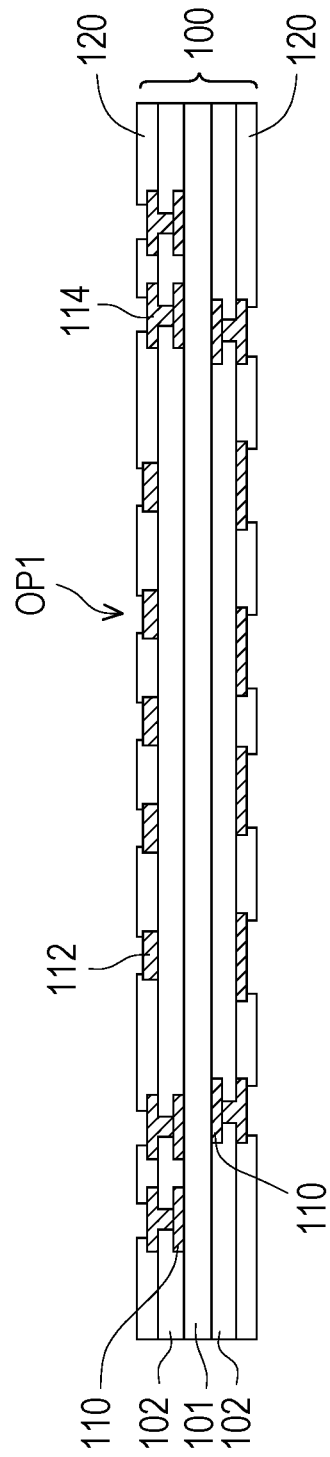
Figure 4C:
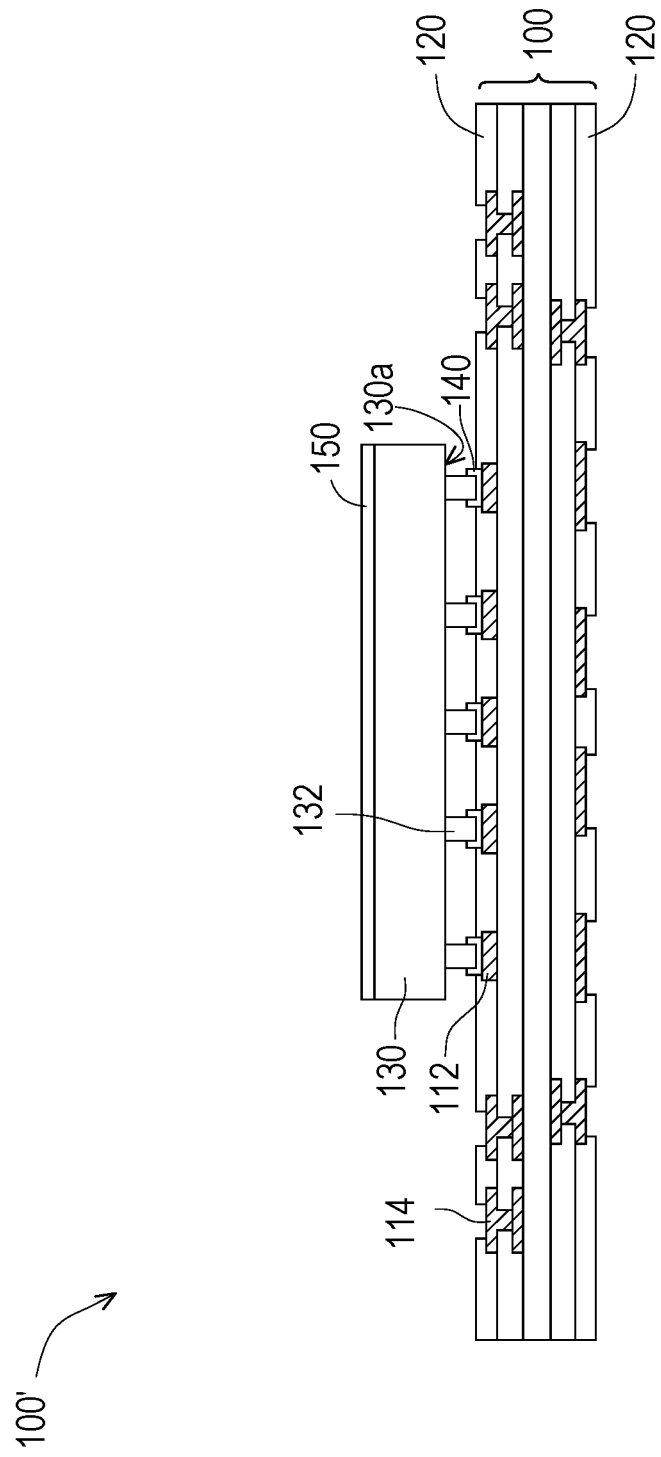

FIG. 4A to FIG. 4C are schematic cross-sectional views illustrating a manufacturing process of a chip disposed on a circuit board according to an embodiment of the disclosure. Note that the reference numbers and some content provided in the embodiment shown in FIG. 1 are also applied in the embodiment depicted in FIG. 4A to FIG. 4C, where the same or similar reference numbers are used to represent the same or similar element, and the description of the same technical content is omitted. The description of the omitted content may be referred to as that provided in the previous embodiment and will not be repeated hereinafter.

With reference to FIG. 4A, a circuit board 100 is provided. For instance, the circuit board 100 may include a core substrate 101, an insulation layer 102, and a circuit layer 110, and the insulation layer 102 and the circuit layer 110 are alternately stacked on both sides of the core substrate 101. The topmost layer of the circuit layer 110 may include a plurality of pads 112 and 114, the pads 112 may be the pads that are subsequently connected to the contacts of the chip 130, and the pads 114 may be the pads that are subsequently connected to the coaxial conductive element 210.

It should be understood that FIG. 4A schematically illustrates the two-layer insulation layer 102 and the four-layer circuit layer 110 on the core layer 101, which should however not be construed as a limitation in the disclosure. The number of insulation layers and the circuit layers and the wiring design of the circuit layer may be adjusted according to actual demands. In addition, although there illustrates no conductive via in the core layer provided in the disclosure, it is not intended to pose a limitation in the disclosure, and the conductive via may be disposed in the core layer according to actual demands.

With reference to FIG. 4B, a solder mask 120 is formed on both sides of the circuit board 100. The solder mask 120 has a plurality of openings OP1 to expose the outermost portion of the circuit layer 110 of the circuit board 100. For instance, the pads 112 and 114 are exposed by the openings OP1 to facilitate subsequent connections to other components. A material of the solder mask 120 may be a solder resist material (e.g., a green paint), a photosensitive dielectric material, or any other appropriate material.

With reference to FIG. 4C, the chip 130 is disposed on the circuit board 100. For instance, the active surface 130a of the chip 130 may include a plurality of contacts 132, and the contacts 132 correspond to the pads 112 of the circuit board 100, so that the chips 130 are disposed on and electrically connected to the circuit board 100.

In some embodiments, before the contacts 132 of the chip 130 and the pads 112 of the circuit board 100 are correspondingly connected, an underfill 140 may be disposed in the openings OP1 exposing the pads 112, and then a subsequent bonding process is performed to improve a bonding strength between the chip 130 and the circuit board 100. Here, a material of the underfill 140 is, for instance, epoxy solder paste or other appropriate materials. In other embodiments, the material of the underfill 140 may also be epoxy flux, epoxy glue, or other appropriate materials, and the underfill 140 may be disposed between the chip 130 and the circuit board 100 after the contacts 132 of the chip 130 and the pads 112 of the circuit board 100 are correspondingly connected. In some other embodiments, instead of disposing the underfill 140, the contacts 132 of the chip 130 may be correspondingly bonded to the pads 112 of the circuit board 100 directly.

In some embodiments, the underfill 140 may be disposed in space between the chip 130 and the circuit board 100 to cover a portion of sidewalls of the contacts 132 in a transverse direction, or the underfill 140 may completely cover the sidewalls of the contacts 132.

In some embodiments, the thermal interface material 150 may be disposed on the back surface 130b of the chip 130, which should however not be construed as a limitation in the disclosure.

After the above manufacturing process, the structure 100' of the circuit board 100 including the chip 130 is substantially formed.

FIG. 5A to FIG. 5F are schematic cross-sectional views illustrating a manufacturing process of an interposer including a coaxial conductive element according to an embodiment of the disclosure. Note that the reference numbers and some content provided in the embodiment shown in FIG. 1 are also applied in the embodiment depicted in FIG. 5A to FIG. 5F, where the same or similar reference numbers are used to represent the same or similar element, and the description of the same technical content is omitted. The description of the omitted content may be referred to as that provided in the previous embodiment and will not be repeated hereinafter.

Figure 5A:
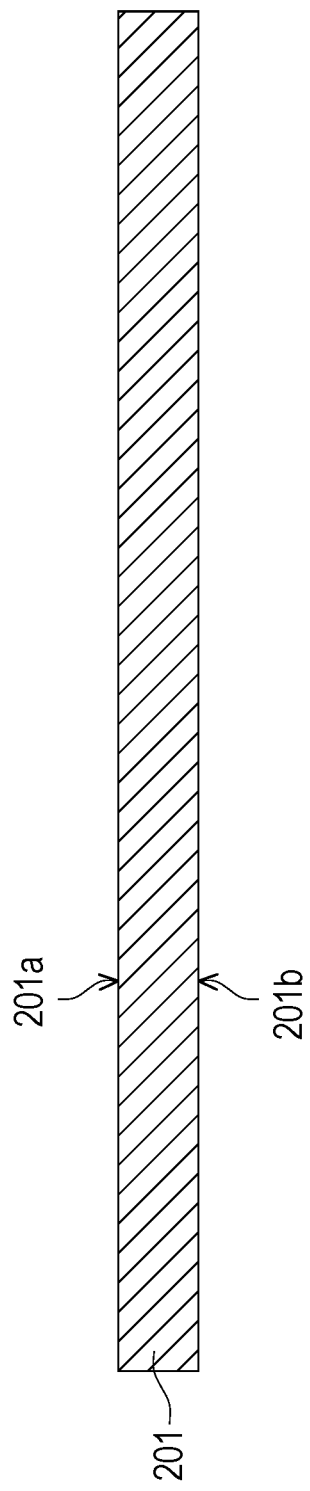
FIG. 5A to FIG. 5F are schematic cross-sectional views illustrating a manufacturing process of an interposer including a coaxial conductive element according to an embodiment of the disclosure.

With reference to FIG. 5A, a core substrate 201 is provided. For instance, the core substrate 201 includes a first side 201a and a second side 201b opposite to the first side 201a. The core substrate 201 may be, for instance, a copper plate, an aluminum plate, an alloy plate, or any other appropriate conductive material. A thickness of the core substrate 201 may range from 150 μm to 250 μm.

Figure 5B:
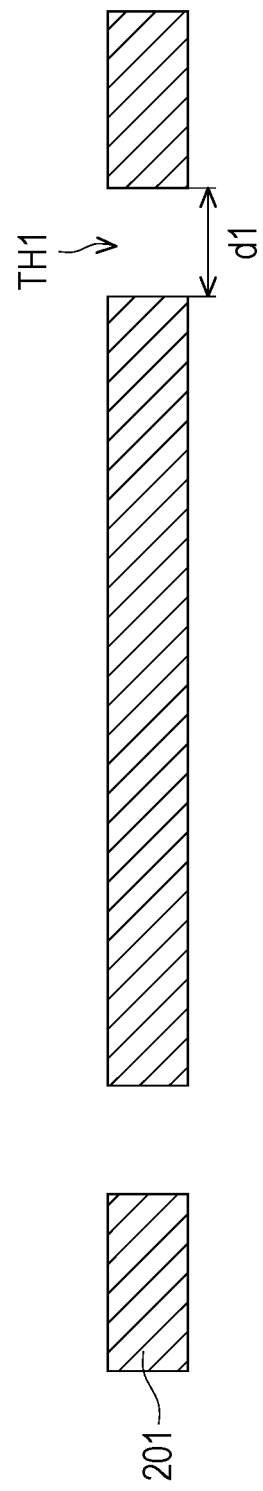

With reference to FIG. 5B, a first through hole TH1 is formed in the core substrate 201. For instance, the first through hole TH1 penetrating the core substrate 201 may be formed in the core substrate 201 through mechanical drilling, etching, or the like. An aperture d1 of the first through hole TH1 may range from 250 μm to 450 μm.

Figure 5C:
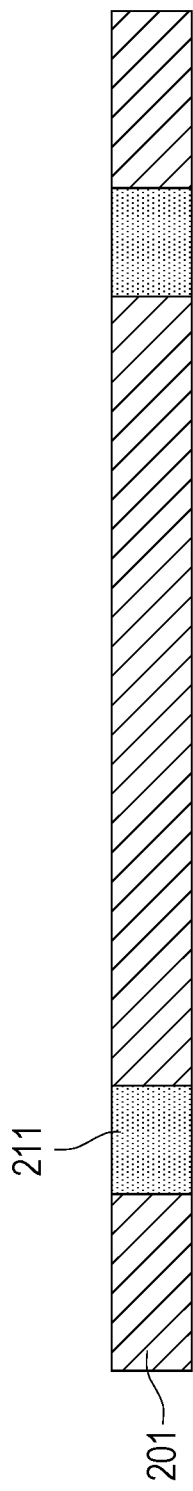

With reference to FIG. 5C, the first through hole TH1 is filled with an insulation material 211. The insulation material 211 may be, for instance, epoxy resin, polyester resin, polyimide, or any other appropriate insulation material.

Figure 5D:
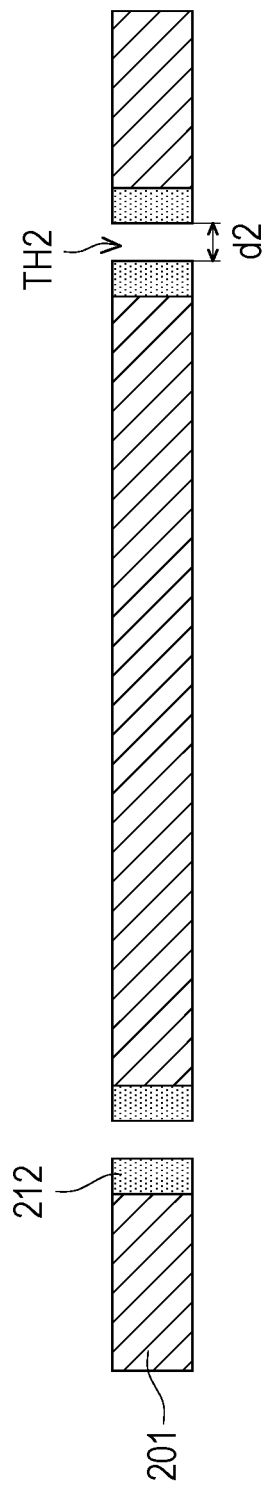

With reference to FIG. 5D, a second through hole TH2 is formed in the insulation material 211 to form the first insulation structure 212. For instance, the second through hole TH2 may be formed at the center of the insulation material 211 through mechanical drilling, laser, or the like. That is, the second through hole TH2 and the first through hole TH1 (shown in FIG. 5B) basically have the same axis. An aperture d2 of the second through hole TH2 may range from 50 μm to 100 μm. Due to the fact that the second through hole TH2 is formed, a portion of the insulation material 211 is removed to form the first insulation structure 212. The first insulation structure 212 is a hollow cylinder; that is, in a top view, the first insulation structure 212 has a ring shape.

Figure 5E:
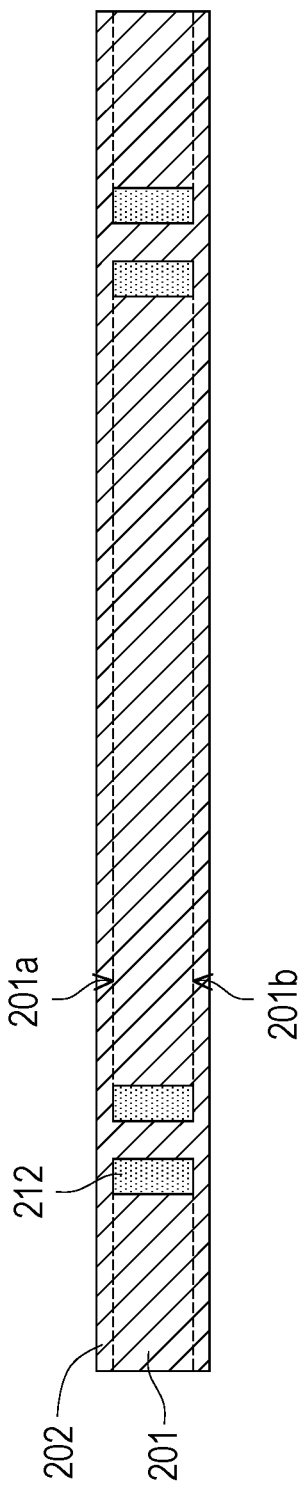

With reference to FIG. 5E, a first conductive material layer 202 is formed on the first side 201a and the second side 201b of the core substrate 201 and in the second through hole TH2 (shown in FIG. 5D). For instance, through electroplating or deposition, a conductive material (such as copper, aluminum, any other appropriate conductive material, or alloy of the above materials) may be formed on the first side 201a and the second side 201b of the core substrate 201, and the second through hole TH2 is filled with the conductive material, so as to form the first conductive material layer 202. In some embodiments, the second through hole TH2 may be completely filled with the first conductive material layer 202.

In some embodiments, a material of the first conductive material layer 202 and the material of the core substrate 201 are the same, and thus there may exist no interface between the first conductive material layer 202 and the core substrate 201. However, in order to clearly describe the manufacturing process, the first conductive material layer 202 and the core substrate 201 are distinguished from each other by dashed lines in FIG. 5E and FIG. 5F.

Figure 5F:
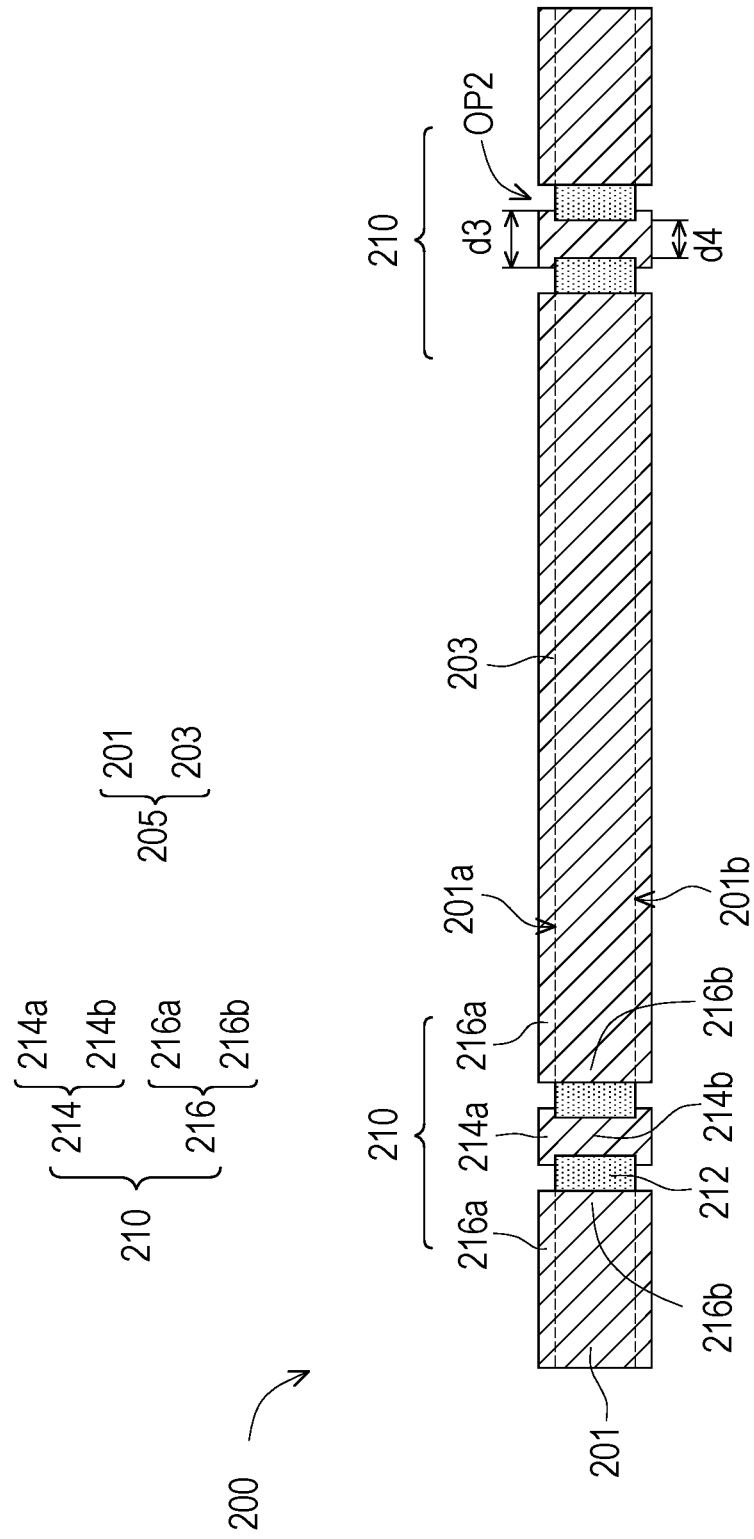

With reference to FIG. 5F, the first conductive material layer 202 is patterned to expose a portion of the first insulation structure 212. For instance, the first conductive material layer 202 may be patterned through etching to remove a portion of the first conductive material layer 202 covering the first insulation structure 212 to form openings OP2 in a first conductive layer 203. That is, the openings OP2 may expose the first insulation structure 212, and the first conductive layer 203 covers the first side 201a and the second side 201b of the core substrate 201 and fills the second through hole TH2 (shown in FIG. 5D). The first insulation structure 212, a portion of the first conductive layer 203, and a portion of the core substrate 201 may constitute the coaxial conductive element 210. In detail, the coaxial conductive element 210 may include the first conductive structure 214, the second conductive structure 216, and the first insulation structure 212. The first conductive structure 214 may include a first conductive pillar 214b and first pads 214a located at both ends of the first conductive pillar 214b. The first pads 214a are disposed on the first side 201a and the second side 201b and overlap the second through hole TH2. The first conductive pillar 214b is located in the second through hole TH2 to electrically connect the first pads 214a at both ends of the first conductive pillar 214b. That is, a portion of the first conductive layer 203 may constitute the first pads 214a and the first conductive pillar 214b. In some embodiments, a diameter of one first pad 214a may be greater than a diameter of the first conductive pillar 214b. For instance, a diameter d3 of one first pad 214a may range from 75 μm to 175 μm, and a diameter d4 of the first conductive pillar 214b may range from 50 μm to 100 μm.

The second conductive structure 216 surrounds the first conductive structure 214. The second conductive structure 216 may include a second conductive pillar 216b and second pads 216a located at both ends of the second conductive pillar 216b. The second pads 216a are disposed on the first side 201a and the second side 201b and surround the first pads 214a, and openings OP2 separate the first pads 214a from the second pads 216a. That is, the second pads 216a are not connected to the first pads 214a. The second conductive pillar 216b is connected to the second pads 216a at both ends of the second conductive pillar 216b and surrounds the first conductive pillar 214b. The first insulation structure 212 is disposed between the first conductive structure 214 and the second conductive structure 216, so that the first conductive structure 214 and the second conductive structure 216 are electrically separated from each other. In this embodiment, the second pads 216a may be constituted by a portion of the first conductive layer 203, and the second conductive pillar 216b may be constituted by a portion of the core substrate 201.

In some embodiments, the core substrate 201 and the first conductive layer 203 may constitute the interposer substrate 205. In other words, a portion of the interposer substrate 205 may constitute the first conductive structure 214 and the second conductive structure 216 of the coaxial conductive element 210.

After the above manufacturing process, the interposer 200 including the coaxial conductive element 210 is substantially formed.

FIG. 6A to FIG. 6F are schematic cross-sectional views illustrating a manufacturing process of an interposer including a coaxial conductive element according to another embodiment of the disclosure. Note that the reference numbers and some content provided in the embodiment shown in FIG. 5A to FIG. 5F are also applied in the embodiment depicted in FIG. 6A to FIG. 6F, where the same or similar reference numbers are used to represent the same or similar element, and the description of the same technical content is omitted. The description of the omitted content may be referred to as that provided in the previous embodiment and will not be repeated hereinafter.

Figure 6A:
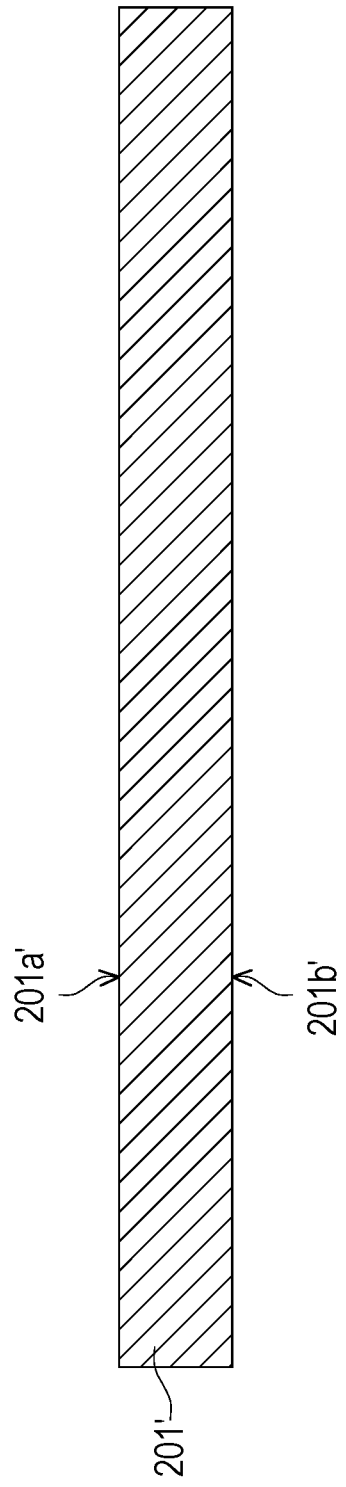
FIG. 6A to FIG. 6F are schematic cross-sectional views illustrating a manufacturing process of an interposer including a coaxial conductive element according to another embodiment of the disclosure.

With reference to FIG. 6A, a core substrate 201' is provided, and the core substrate 201' has a first side 201a' and a second side 201b' opposite to the first side 201a'. The core substrate 201' may be, for instance, a copper plate, an aluminum plate, an alloy plate, or any other appropriate conductive material. A thickness of the core substrate 201' may range from 150 μm to 250 μm.

Figure 6B:
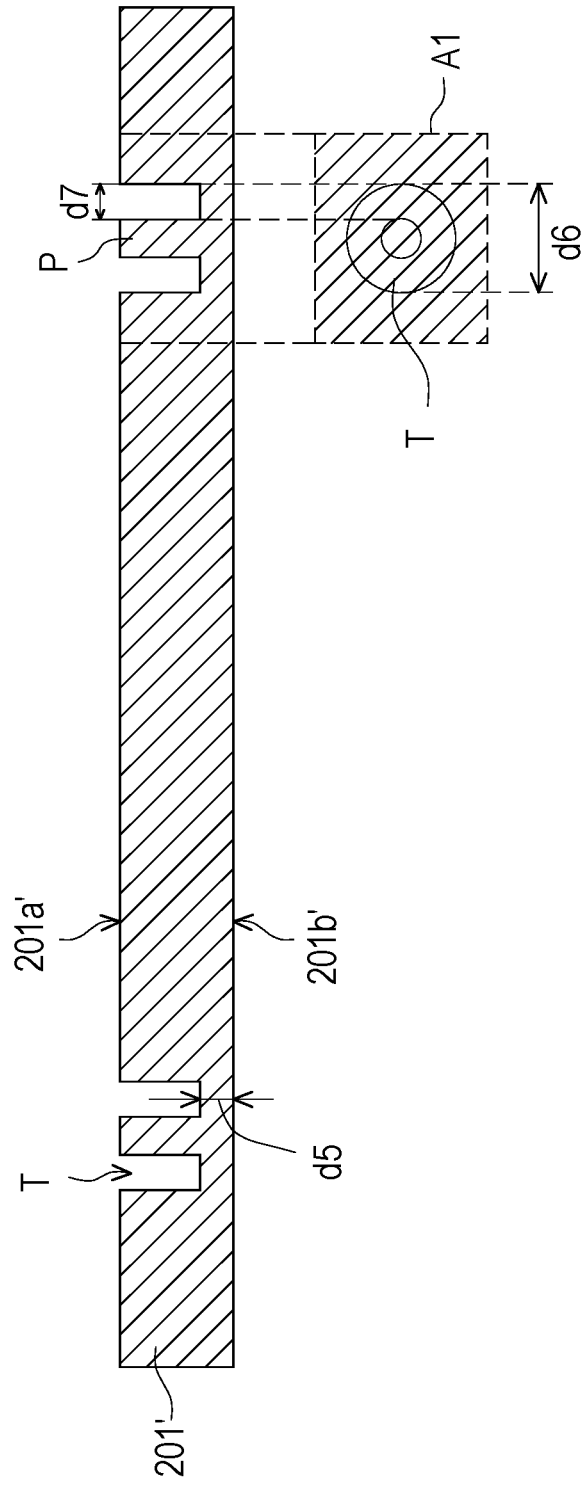

With reference to FIG. 6B, a ring-shaped groove T is formed on the first side 201a' of the core substrate 201', where the ring-shaped groove T does not penetrate the second side 201b' of the core substrate 201'. For instance, the ring-shaped groove T may be formed through etching the first side 201a' of the core substrate 201', as shown by a region A1 in FIG. 6B, and the region A1 is a schematic top view of the ring-shaped groove T. A portion P of the core substrate 201' surrounded by the ring-shaped groove T and the ring-shaped groove T substantially have the same axis.

In some embodiments, a distance d5 from the bottom surface of the ring-shaped groove T to the second side 201b' may range from 50 μm to 100 μm, which should however not be construed as a limitation in the disclosure. In some embodiments, an outer diameter d6 of the ring-shaped groove T may range from 250 μm to 450 μm, which should however not be construed as a limitation in the disclosure. In some embodiments, a width d7 of the ring-shaped groove T may range from 100 μm to 175 μm, which should however not be construed as a limitation in the disclosure.

Figure 6C:
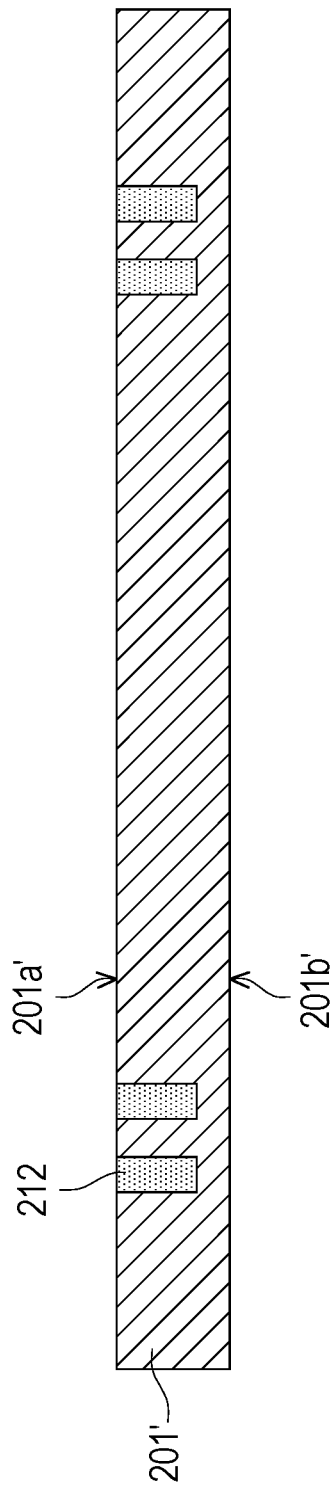

With reference to FIG. 6C, the ring-shaped groove T is filled with an insulation material to form the first insulation structure 212.

Figure 6D:
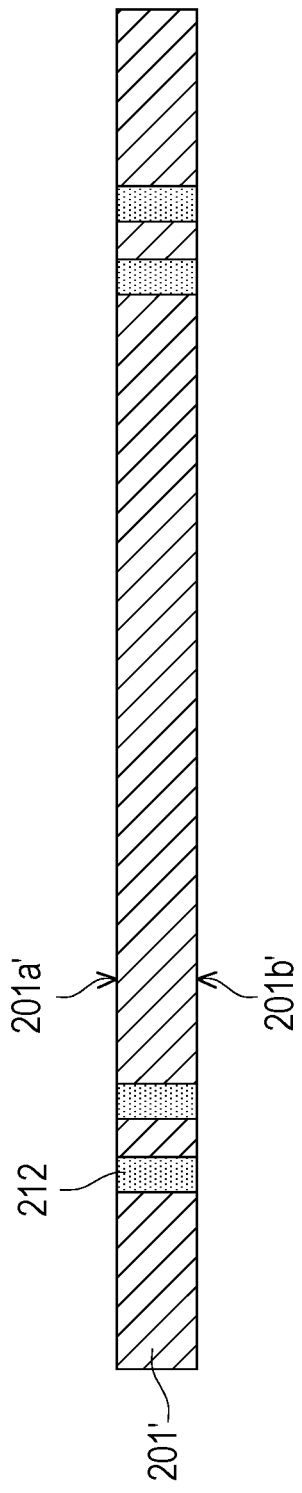

With reference to FIG. 6D, a portion of the core substrate 201' is removed from the second side 201b' of the core substrate 201' until the first insulation structure 212 is exposed. For instance, the portion of the core substrate 201' may be removed through etching, mechanical polishing, or the like, so that the second side 201b' of the core substrate 201' and the bottom surface of the first insulation structure 212 are levelled.

Figure 6E:
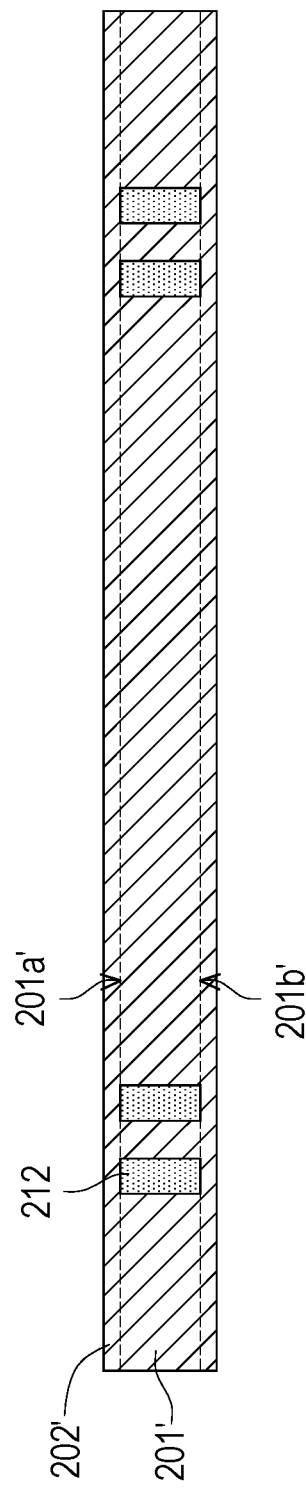

With reference to FIG. 6E, a first conductive material layer 202' is formed on the first side 201a' and the second side 201b' of the core substrate 201'. For instance, through electroplating or deposition, a conductive material (such as copper, aluminum, any other appropriate conductive material, or alloy of the above materials) may be formed on the first side 201a' and the second side 201b' of the core substrate 201' and covers the first insulation structure 212, so as to form the first conductive material layer 202'. In some embodiments, a material of the first conductive material layer 202' and the material of the core substrate 201' are the same, and thus there may exist no interface between the first conductive material layer 202' and the core substrate 201'. However, in order to clearly describe the manufacturing process, the first conductive material layer 202' and the core substrate 201' are distinguished from each other by dashed lines in FIG. 6E and FIG. 6F.

Figure 6F:
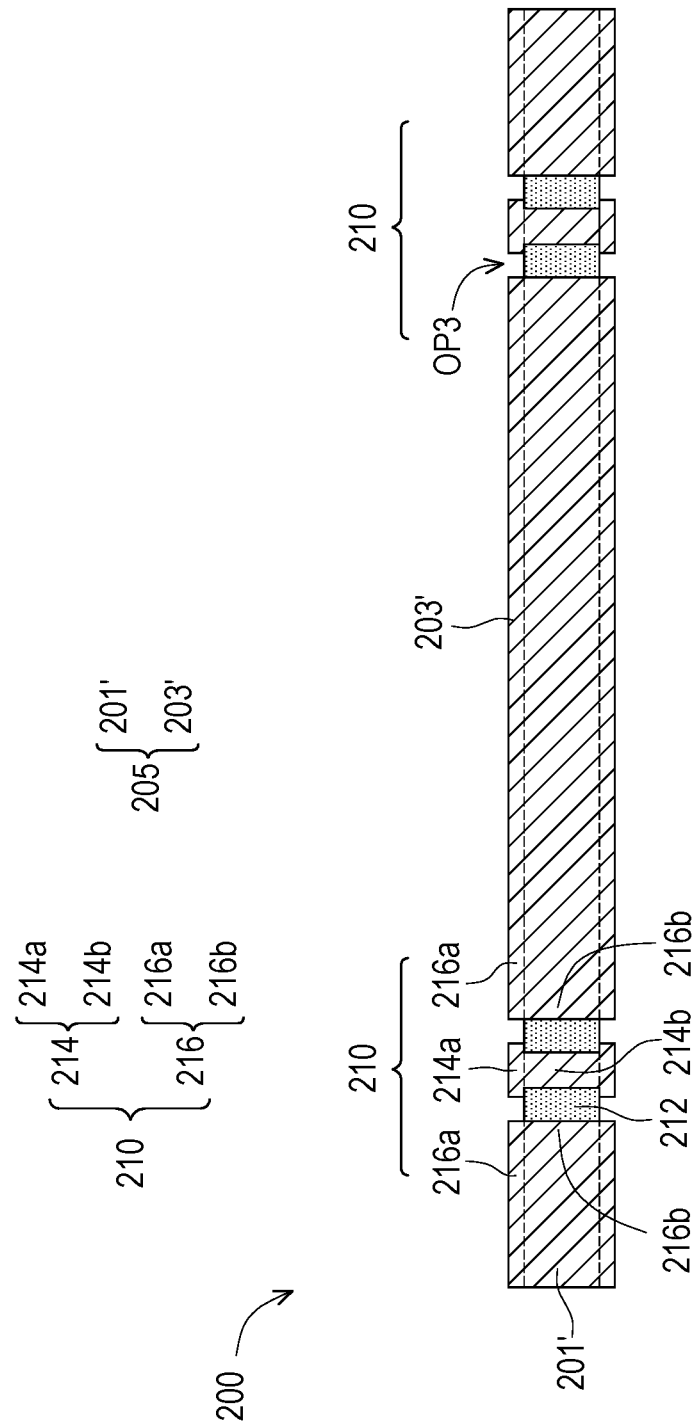

With reference to FIG. 6F, the first conductive material layer 202' is patterned to expose a portion of the first insulation structure 212. For instance, the first conductive material layer 202' may be patterned through etching to remove a portion of the first conductive material layer 202' covering the first insulation structure 212 to form openings OP3 in a first conductive layer 203'. That is, the openings OP3 may expose the first insulation structure 212, and the first conductive layer 203' covers the first side 201a' and the second side 201b' of the core substrate 201'. The first insulation structure 212, a portion of the first conductive layer 203', and a portion of the core substrate 201' may constitute the coaxial conductive element 210. In detail, the coaxial conductive element 210 may include the first conductive structure 214, the second conductive structure 216, and the first insulation structure 212. The first conductive structure 214 may include a first conductive pillar 214b and first pads 214a located at both ends of the first conductive pillar 214b. The first pads 214a are disposed on the first side 201a' and the second side 201b' and overlaps the portion P (shown in FIG. 6B) surrounded by the ring-shaped groove T (shown in FIG. 6B), and the first conductive pillar 214b is constituted by the portion P surrounded by the ring-shaped groove T (shown in FIG. 6B) to electrically connect the first pads 214a at both ends of the first conductive pillar 214b. That is, a portion of the first conductive layer 203' may constitute the first pads 214a, and the core substrate 201' may constitute the first conductive pillar 214b.

The second conductive structure 216 surrounds the first conductive structure 214. The second conductive structure 216 may include the second conductive pillar 216b and the second pads 216a located at both ends of the second conductive pillar 216b. The second pads 216a are disposed on the first side 201a' and the second side 201b' and surrounds the first pads 214a, and openings OP3 separate the first pads 214a from the second pads 216a. That is, the second pads 216a are not connected to the first pads 214a.

The second conductive pillar 216b is connected to the second pads 216a at both ends of the second conductive pillar 216b and surrounds the first conductive pillar 214b. The first insulation structure 212 is disposed between the first conductive structure 214 and the second conductive structure 216, so that the first conductive structure 214 and the second conductive structure 216 are electrically separated from each other. In this embodiment, the second pads 216a may be constituted by a portion of the first conductive layer 203', and the second conductive pillar 216b may be constituted by a portion of the core substrate 201'.

In some embodiments, the core substrate 201' and the first conductive layer 203' may constitute interposer substrate 205. In other words, a portion of the interposer substrate 205 may constitute the first conductive structure 214 and the second conductive structure 216 of the coaxial conductive element 210.

After the above manufacturing process, the interposer 200 including the coaxial conductive element 210 is substantially formed.

FIG. 7A to FIG. 7D are schematic cross-sectional views illustrating a manufacturing process of a first conductive connection element according to an embodiment of the disclosure. FIG. 8A and FIG. 8B are schematic top views illustrating a portion of a region R1 depicted in FIG. 7B. Note that the reference numbers and some content provided in the embodiment shown in FIG. 1 are also applied in the embodiment depicted in FIG. 7A to FIG. 7D, where the same or similar reference numbers are used to represent the same or similar element, and the description of the same technical content is omitted. The description of the omitted content may be referred to as that provided in the previous embodiment and will not be repeated hereinafter.

Figure 7A:
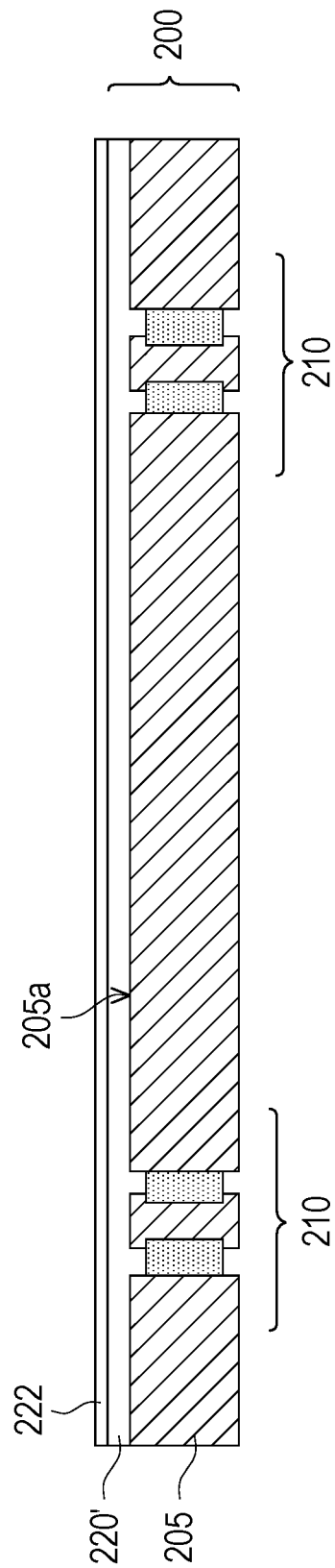
FIG. 7A to FIG. 7D are schematic cross-sectional views illustrating a manufacturing process of a first conductive connection element according to an embodiment of the disclosure.
Figure 8B:
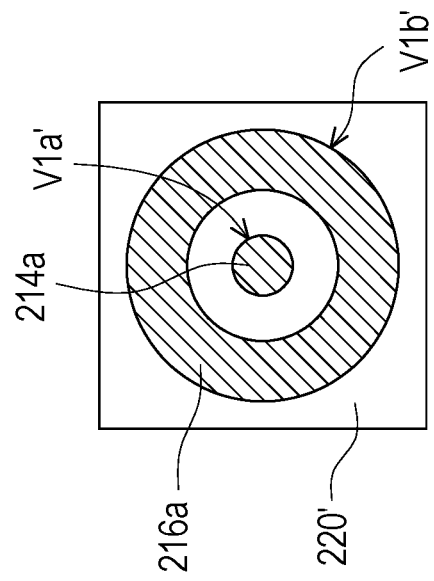
FIG. 8A and FIG. 8B are schematic top views illustrating a portion of a region R1 depicted in FIG. 7B.
Figure 8A:
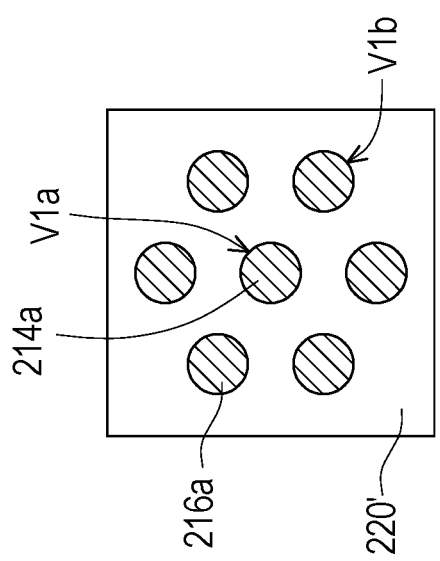

With reference to FIG. 7A, a first adhesive material layer 220' is formed on one side of the interposer 200. For instance, the interposer 200 may be the interposer 200 including the coaxial conductive element 210, which is formed in the manner illustrated in FIG. 5A to FIG. 5F, or the interposer 200 including the coaxial conductive element 210, which is formed in the manner illustrated in FIG. 6A to FIG. 6F. The relevant content may be referred to as that provided in the previous embodiments and will not be repeated hereinafter. The first adhesive material layer 220' may be formed on the upper surface 205a of the interposer substrate 205 of the interposer 200 through lamination, so that the first adhesive material layer 220' covers the first pads 214a and the second pads 216a located on the upper surface 205a of the interposer substrate 205. The first adhesive material layer 220' may be in a semi-curing state. For instance, the first adhesive material layer 220' may include resin in a semi-curing state, such as B-stage epoxy glue/tape, prepreg (PP) containing the B-stage epoxy resin, or any other appropriate material. In some embodiments, the other side of the first adhesive material layer 220' that is not in contact with the interposer substrate 205 may include a release film 222; that is, the first adhesive material layer 220' is located between the interposer substrate 205 and the release film 222, which should however not be construed as a limitation in the disclosure.

Figure 7B:
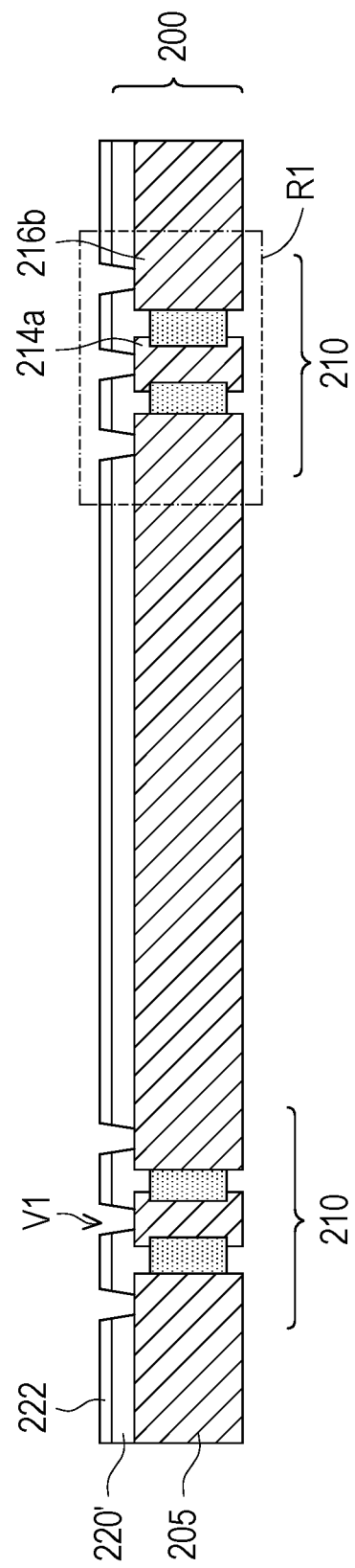

With reference to FIG. 7B, a plurality of vias V1 are formed in the first adhesive material layer 220' to expose a portion of the coaxial conductive element 210. For instance, the vias V1 may be formed in the first adhesive material layer 220' and the release film 222 (if any) through laser drilling. The vias V1 may expose a portion of the first pads 214a and a portion of the second pads 216a of the coaxial conductive element 210.

According to some embodiments, in a top view as shown in FIG. 8A, the vias V1 may include a via V1a and a plurality of vias V1b surrounding the via V1a. The via V1a corresponds to the first pads 214a to expose a portion of the first pads 214a, and the vias V1b correspond to the second pads 216a to expose a portion of the second pads 216a. In this embodiment, six vias V1b surrounding the via V1a are schematically shown, which should however not be construed as a limitation in the disclosure, and the number of the vias V1b may be adjusted according to actual demands. For instance, the shortest distance between the adjacent vias V1b may be designed to be less than or equal to ¹⁄₁₀ the wavelength of the to-be-transmitted radio wave.

According to other embodiments, in a top view as shown in FIG. 8B, a plurality of vias V1 may include a via V1a' and one single via V1b' surrounding the via V1a'. The shape of the via V1b' may be a ring shape corresponding to the second pads 216a to expose a portion of the second pads 216a.

Figure 7C:
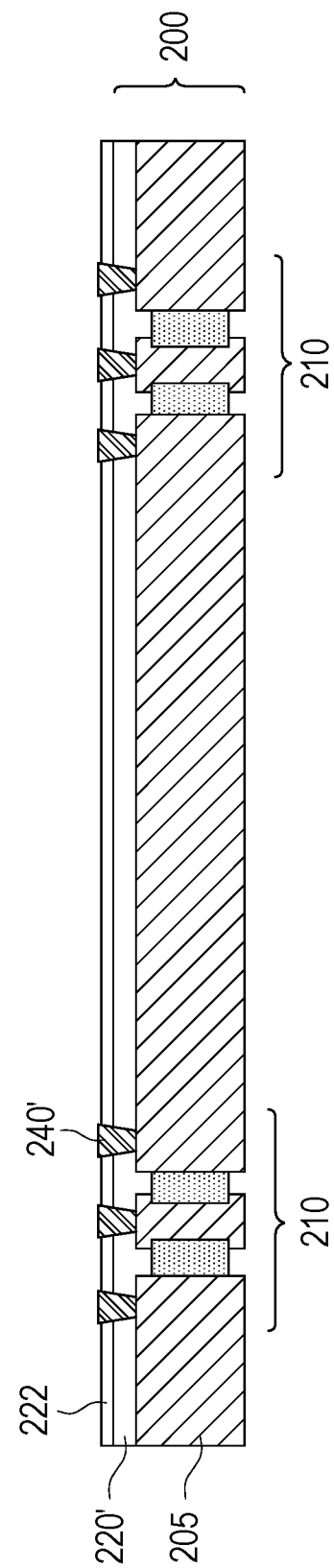
Figure 7D:
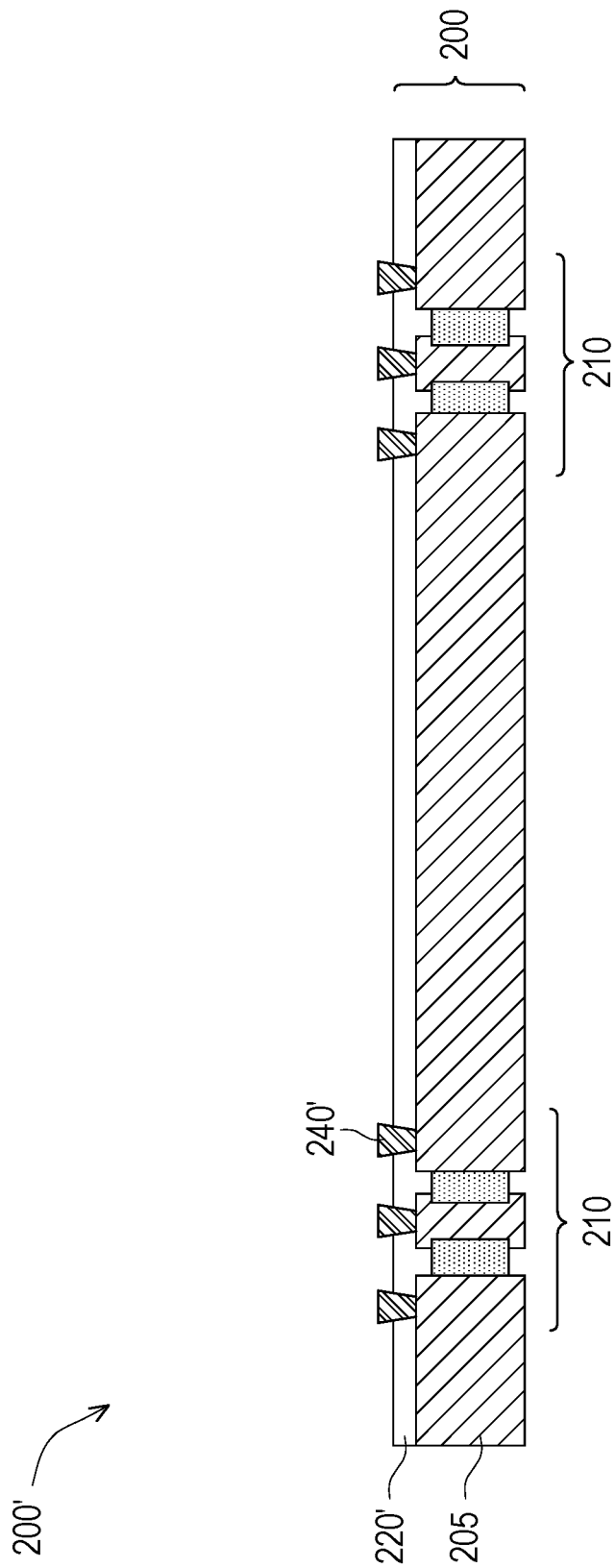

With reference to FIG. 7C and FIG. 7D, first conductive connection materials 240' are formed in the vias V1, and the release film 222 (if any) is removed. The first conductive connection materials 240' may be, for instance, made of silver glue, copper glue, transient liquid phase sintering (TLPS) conductive glue, or any other appropriate material.

After the above manufacturing process, the structure 200' of the interposer 200 including the coaxial conductive element 210 and the first conductive connection material 240' is substantially formed.

FIG. 9A to FIG. 9C are schematic views illustrating a circuit structure according to an embodiment of the disclosure. Note that the reference numbers and some content provided in the embodiment shown in FIG. 1 are also applied in the embodiment depicted in FIG. 9A to FIG. 9C, where the same or similar reference numbers are used to represent the same or similar element, and the description of the same technical content is omitted. The description of the omitted content may be referred to as that provided in the previous embodiment and will not be repeated hereinafter.

With reference to FIG. 9A to FIG. 9C, the circuit structure 300 includes the first core layer 301, the first antenna layer 312, the second antenna layer 314, and a plurality of pads 316. The first core layer 301 has the first surface 301a and the second surface 301b opposite to the first surface 301a. The first antenna layer 312 is disposed on the first surface 301a. The second antenna layer 314 and the pads 316 are disposed on the second surface 301b. That is, the second antenna layer 314 and the pads 316 belong to the same film layer. The pads 316 may correspond to the coaxial conductive element 210 to facilitate subsequent connection to the coaxial conductive element 210. For instance, the pads 316 may include the first pad 316a and the second pad 316b. The first pad 316a corresponds to the first pad 214a of the coaxial conductive element 210, and the second pad 316b corresponds to the second pad 216a of the coaxial conductive element 210.

In some embodiments, as shown in FIG. 9B, the number of the second pad 316b may be plural, i.e., second pads 316b'. The second pads 316b' correspond to the second conductive structure 216 of the coaxial conductive element 210, where the second pad 316b' surround the first pad 316a. In other embodiments, as shown in FIG. 9C, the second pad 316b may be one single second pad 316b. The second pad 316b has a ring shape and surrounds the first pad 316a, and the second pad 316b may correspond to the second conductive structure 216 of the coaxial conductive element 210.

In some embodiments, the circuit structure 300 further includes conductive layers 311 and 313 and insulation layers 302 and 303. The conductive layers 311 and 313 are respectively disposed on the first surface 301a and the second surface 301b of the first core layer 301. The insulation layer 302 is disposed between the conductive layer 311 and the first antenna layer 312 and has a conductive via CV1 disposed in the insulation layer 302, so that the conductive layer 311 and the first antenna layer 312 are electrically connected. The insulation layer 303 is disposed between the conductive layer 313 and the second antenna layer 314 and has a conductive via CV2 disposed in the insulation layer 303, so that the conductive layer 313 and the second antenna layer 314 or the pad 316 are electrically connected.

In some embodiments, the circuit structure 300 further includes a conductive pillar 305 penetrating the first core layer 301 to electrically connect the conductive layer 311 and the conductive layer 313. The conductive pillar 305 may be, for instance, a solid metal pillar or a hollow metal pillar filled with an insulation material, which should not be construed as a limitation in the disclosure. In other embodiments, the circuit structure 300 may not include the conductive pillar penetrating the first core layer 301.

It should be understood that FIG. 9A schematically illustrates the insulation layers, the conductive layers, and the antenna layers of the circuit structure 300, which should however not be construed as a limitation in the disclosure. The number and the wiring design of the insulation layers, the conductive layers, and the antenna layers may be adjusted according to actual demands.

FIG. 10A to FIG. 10E are schematic cross-sectional views illustrating a manufacturing process of an electronic package structure according to an embodiment of the disclosure.

Figure 10A:
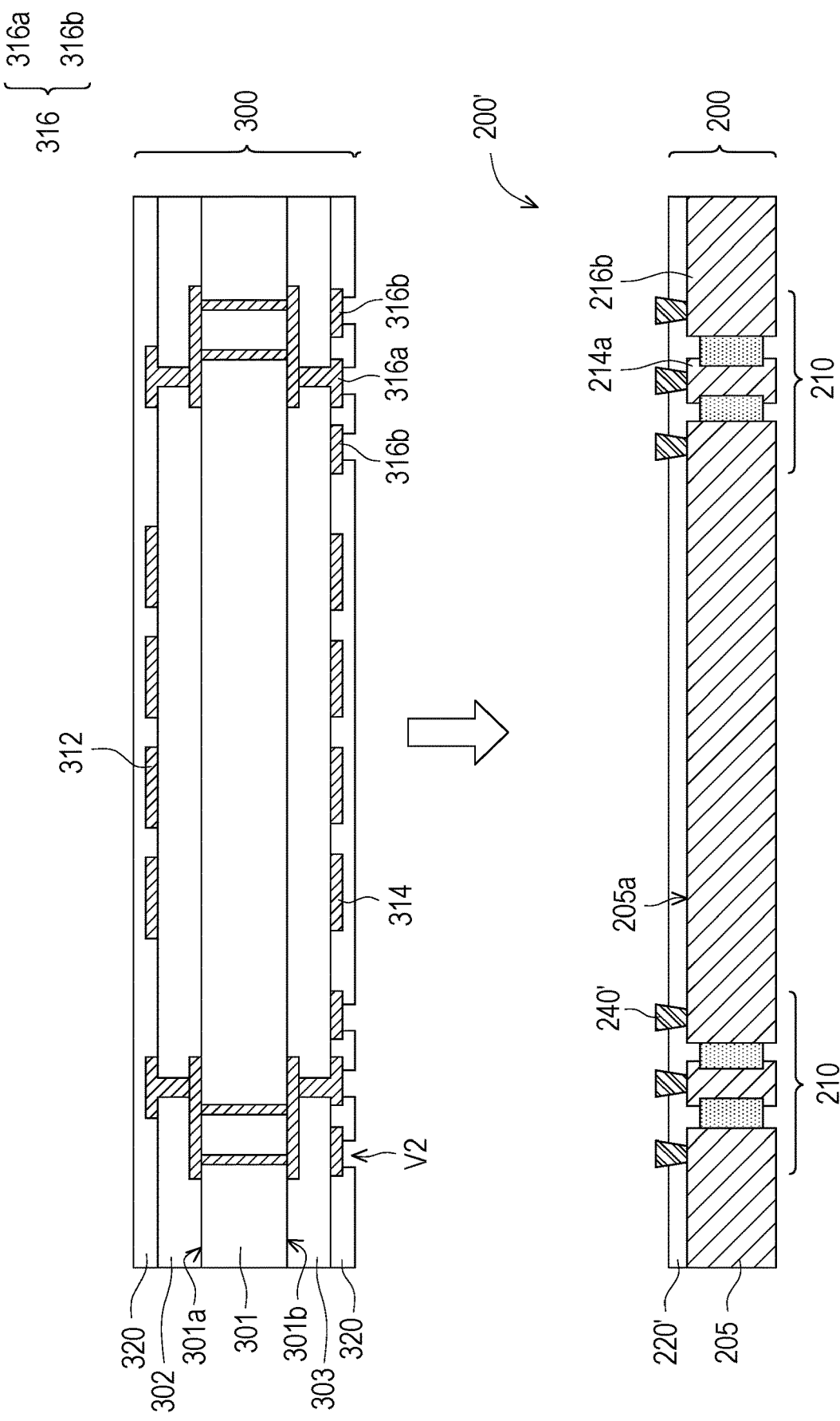
FIG. 10A to FIG. 10E are schematic cross-sectional views illustrating a manufacturing process of an electronic package structure according to an embodiment of the disclosure.

With reference to FIG. 10A, a circuit structure 300 is provided. The circuit structure 300 is, for instance, the circuit structure 300 shown in the FIG. 9A. The relevant content may be referred to as that provided in the previous embodiments and will not be repeated hereinafter. A solder mask 320 is formed on surfaces of the insulation layers 302 and 303 to cover the first antenna layer 312 and the second antenna layer 314. The solder mask 320 has a plurality of vias V2 to expose a portion of the pads 316. A material of the solder mask 320 may be a solder resist material (e.g., a green paint), a photosensitive dielectric material, or any other appropriate material.

Figure 10B:
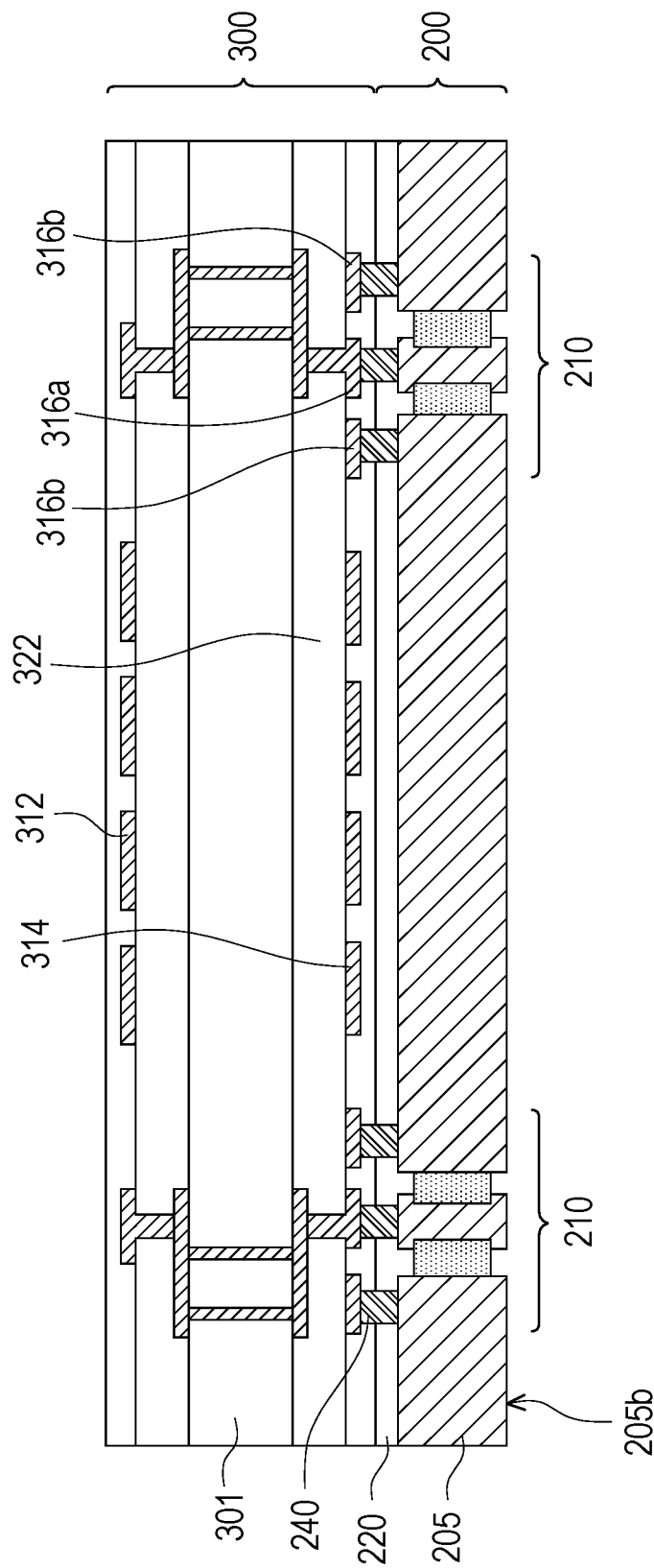

With reference to FIG. 10A and FIG. 10B, the pads 316 of the circuit structure 300 are connected corresponding to the first conductive connection materials 240' disposed on the interposer 200. For instance, the first conductive connection materials 240' may be disposed on the interposer 200, as shown by the structure 200' in FIG. 7D. The relevant content may be referred to as that provided in the previous embodiments and will not be repeated hereinafter. The first conductive connection material 240' disposed on the first pad 214a of the coaxial conductive element 210 is correspondingly connected to the pad 316a of the circuit structure 300, and the first conductive connection materials 240' disposed on the second pads 216a of the coaxial conductive element 210 are correspondingly connected to the pads 316b of the circuit structure 300.

After that, at a first temperature, the circuit structure 300 and the interposer 200 are laminated to form the first adhesion layer 220 by curing the first adhesive material layer 220' to a C-stage. The first temperature, for instance, ranges from 180° C. to 220° C.

In some embodiments, the first conductive connection material 240' may be heated and melted at the first temperature, and then the first conductive connection element 240 may be cured to form the first conductive connection element 240, so that the pads 316 of the circuit structure 300 and the corresponding coaxial conductive element 210 may be well bonded and electrically connected. In some embodiments, if the first conductive connection material 240' is the TLPS conductive glue, the first conductive connection material 240' including metal solder particles (such as copper, tin-bismuth alloy, and so on) may be heated to generate a combination of liquid-phase metal particles in the interface, and an intermetallic compound (IMC) may then be formed through performing a curing process, so as to enhance the bonding force at the interface and ensuring good conductivity.

Figure 10C:
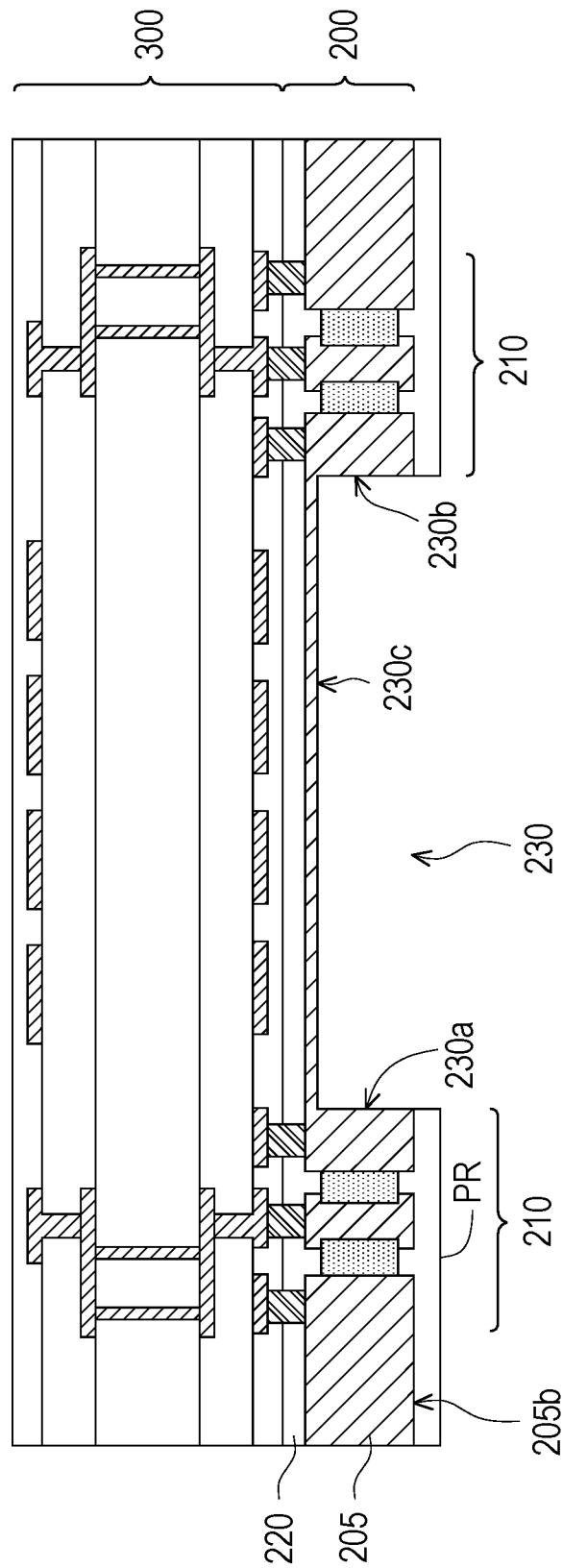

With reference to FIG. 10C, a cavity 230 is formed on the lower surface 205b of the interposer substrate 205 to form the interposer 200. For instance, a patterned photoresist layer PR may be formed on the lower surface 205b of the interposer substrate 205 first. The patterned photoresist layer PR covers the coaxial conductive element 210 and exposes the lower surface 205b of a portion of the interposer substrate 205. The patterned photoresist layer PR is then applied as a mask to etch the interposer substrate 205, so as to form the cavity 230. In this embodiment, the cavity 230 formed through performing the etching process does not penetrate the interposer substrate 205, and thus the cavity 230 is constituted by the sidewalls 230a and 230b and the bottom surface 230c of the interposer substrate 205, which should however not be construed as a limitation in the disclosure. In other embodiments, the cavity 230 formed through performing the etching process may penetrate the interposer substrate 205 and expose the first adhesion layer 220.

Figure 10D:
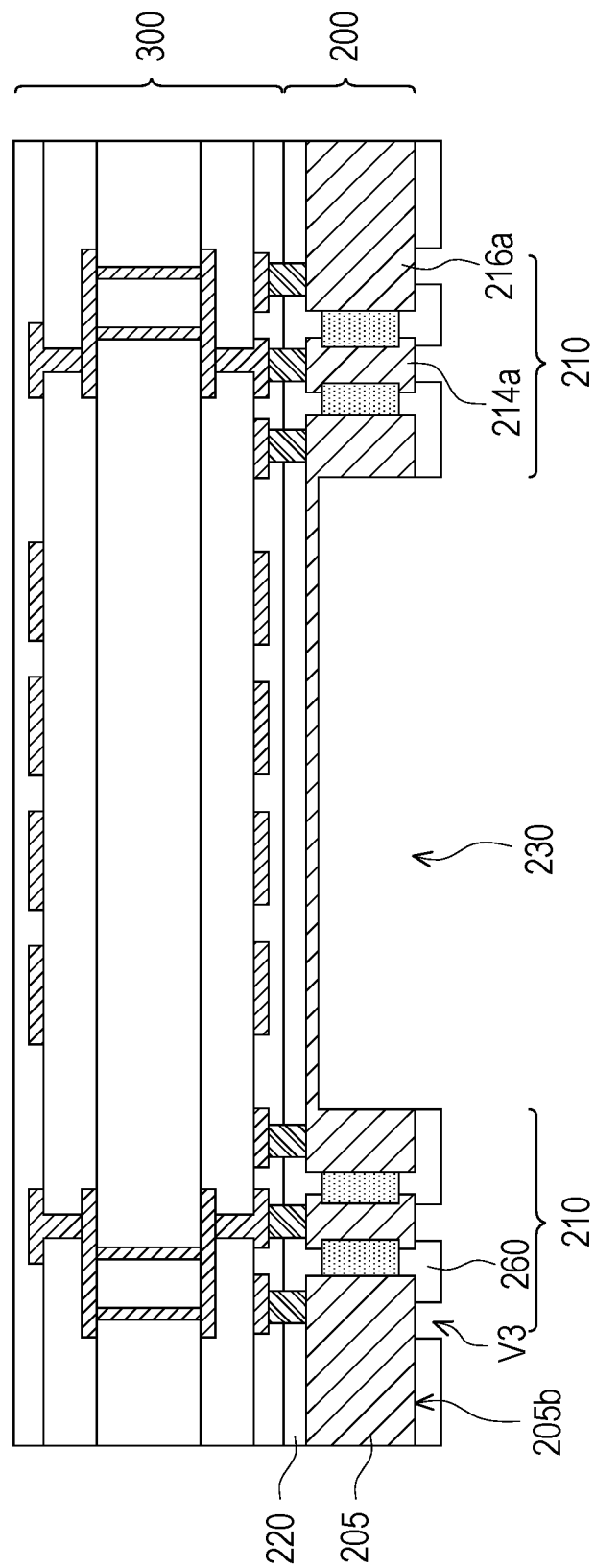

With reference to FIG. 10D, the patterned photoresist layer PR is removed. A solder mask 260 is formed on the lower surface 205b of the interposer substrate 205. The solder mask 260 includes a plurality of vias V3 to expose a portion of the coaxial conductive element 210, e.g., a portion of the first pads 214a and a portion of the second pads 216a of the coaxial conductive element 210 on the surface 205b. A material of the solder mask 260 may be a solder resist material (e.g., a green paint), a photosensitive dielectric material, or any other appropriate material.

Figure 10E:
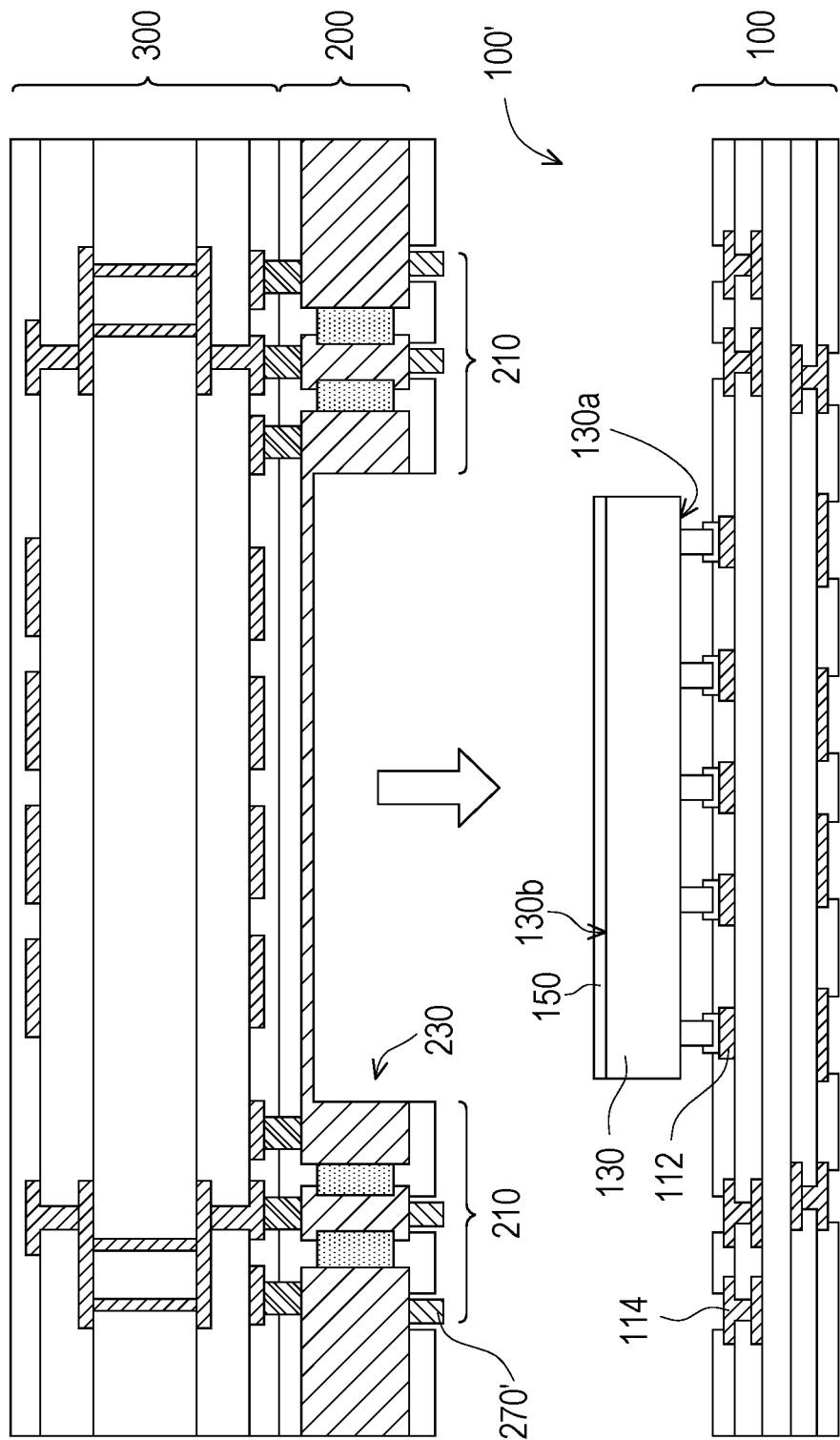

With reference to FIG. 10E, second conductive connection materials 270' are formed in the vias V3 (shown in FIG. 10D). The second conductive connection materials 270' may be, for instance, made of solder paste, solder balls, or any other appropriate material.

After that, with reference to FIG. 1, at a second temperature, the circuit board 100 is bonded onto the lower surface 205b of the interposer substrate 205, and the chip 130 is disposed in the cavity 230. For instance, the chip 130 may be disposed on the circuit board 100, as shown by the structure 100' in FIG. 4C. The relevant content may be referred to as that provided in the previous embodiments and will not be repeated hereinafter. The chip 130 corresponds to the cavity 230 of the interposer substrate 205, and the second conductive connection materials 270' are correspondingly connected to the pads 114 of the circuit board 100. As such, the second conductive connection materials 270' may be applied to bond and electrically connect the interposer 200 and the circuit board 100'. In some embodiments, the second conductive connection materials 270' may undergo a reflow process at the second temperature to form the second conductive connection element 270, which may improve the bonding strength of the interposer 200 and the circuit board 100. In some embodiments, the second temperature ranges from 250° C. to 270° C.

After the above manufacturing process, the electronic package structure 10 is substantially formed.

To sum up, in the electronic package structure provided in one or more embodiments of the disclosure, the circuit board, the interposer, and the circuit structure may be integrated into one package structure, and the chip is disposed in the cavity of the interposer, so as to effectively utilize the space, which is further conducive to miniaturization of the electronic package structure. Besides, the interposer is made of the conductive material, whereby the heat dissipation capacity of the chip is improved. Moreover, the interposer includes the coaxial conductive element that is configured to electrically connect the circuit structure and the circuit board, so as to reduce loss of radio frequency signals received by or sent from the circuit structure during the signal transmission and shield the EMI signals. As such, signal integrity may be enhanced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic package structure, comprising: an interposer, comprising: an interposer substrate, having an upper surface and a lower surface opposite to the upper surface, wherein the interposer substrate is made of an electrically conductive material and comprises a cavity, and the cavity extends from the lower surface of the interposer substrate to the upper surface of the interposer substrate but not extends through the upper surface of the interposer substrate; and a coaxial conductive element, located in the interposer substrate and comprising: a first conductive structure; a second conductive structure, surrounding the first conductive structure; and a first insulation structure, disposed between the first conductive structure and the second conductive structure; a circuit board, disposed on the lower surface of the interposer substrate and electrically connected to the coaxial conductive element; a chip, disposed in the cavity and located on the circuit board, so as to be electrically connected to the circuit board; and a circuit structure, disposed on the upper surface of the interposer substrate and electrically connected to the coaxial conductive element.

2. The electronic package structure according to claim 1, further comprising:
a thermal interface material, disposed on a back surface of the chip and contacting the interposer substrate.

3. The electronic package structure according to claim 1, wherein the circuit structure comprises:
a first core layer, having a first surface and a second surface opposite to the first surface, wherein the second surface faces the interposer;
a first antenna layer, disposed on the first surface;
a second antenna layer, disposed on the second surface; and
a plurality of pads, disposed on the second surface and corresponding to the coaxial conductive element.

4. The electronic package structure according to claim 3, wherein the pads comprise:
a first pad, corresponding to the first conductive structure of the coaxial conductive element; and
a second pad, corresponding to the second conductive structure of the coaxial conductive element, wherein the second pad has a ring shape.

5. The electronic package structure according to claim 3, wherein the pads comprise:
a first pad, corresponding to the first conductive structure of the coaxial conductive element; and
a plurality of second pads, corresponding to the second conductive structure of the coaxial conductive element, wherein the second pads surround the first pad.

6. The electronic package structure according to claim 3, further comprising:
a first conductive connection element, disposed between the pads of the circuit structure and the coaxial conductive element.

7. The electronic package structure according to claim 1, further comprising:
a first adhesion layer, disposed between the interposer and the circuit structure.

8. The electronic package structure according to claim 1, wherein the circuit board comprises the pads corresponding to the coaxial conductive element, and the electronic package structure further comprises:
a second conductive connection element, disposed between the circuit board and the coaxial conductive element.

9. The electronic package structure according to claim 1, wherein the first conductive structure of the coaxial conductive element is adapted to transmit a signal, and the second conductive structure is adapted to be grounded or connected to a power source.

10. A manufacturing method of an electronic package structure, comprising: providing a circuit board; placing a chip on the circuit board; providing an interposer, the interposer comprising: an interposer substrate, having an upper surface and a lower surface opposite to the upper surface, wherein the interposer substrate is made of an electrically conductive material; and a coaxial conductive element, located in the interposer substrate and comprising: a first conductive structure; a second conductive structure, surrounding the first conductive structure; and a first insulation structure, disposed between the first conductive structure and the second conductive structure; providing a circuit structure, and laminating the circuit structure onto the upper surface of the interposer substrate at a first temperature; forming a cavity on the lower surface of the interposer substrate, wherein the cavity extends from the lower surface of the interposer substrate to the upper surface of the interposer substrate but not extends through the upper surface of the interposer substrate; and bonding the circuit board onto the lower surface of the interposer substrate at a second temperature, and placing the chip in the cavity.

11. The manufacturing method according to claim 10, wherein the step of providing the interposer comprises:
providing a core substrate, the core substrate having a first side and a second side opposite to the first side;
forming a first through hole in the core substrate;
filling the first through hole with an insulation material;
forming a second through hole in the insulation material to form the first insulation structure;
forming a first conductive material layer on the first side and the second side of the core substrate and in the second through hole; and
patterning the first conductive material layer to expose a portion of the first insulation structure.

12. The manufacturing method according to claim 11, wherein an aperture of the first through hole ranges from 250 μm to 450 μm, and an aperture of the second through hole ranges from 50 μm to 100 μm.

13. The manufacturing method according to claim 10, wherein the step of providing the interposer comprises:
   providing a core substrate, the core substrate having a first side and a second side opposite to the first side;
   forming a ring-shaped groove on the first side of the core substrate, wherein the ring-shaped groove does not penetrate the second side of the core substrate;
   filling the ring-shaped groove with an insulation material to form the first insulation structure;
   removing a portion of the core substrate from the second side of the core substrate until the first insulation structure is exposed;
   forming a first conductive material layer on the first side and the second side of the core substrate; and
   patterning the first conductive material layer to expose a portion of the first insulation structure.

14. The manufacturing method according to claim 10, further comprising:
   forming a first adhesive material layer on the upper surface of the interposer substrate, wherein the first adhesive material layer is in a semi-curing state;
   forming a plurality of vias in the first adhesive material layer to expose a portion of the coaxial conductive element; and
   forming a first conductive connection material in the vias.

15. The manufacturing method according to claim 14, wherein the first conductive connection material comprises a copper glue, a silver glue, or a transient liquid phase sintering glue.

16. The manufacturing method according to claim 14, wherein the step of laminating the circuit structure onto the upper surface of the interposer substrate comprises:
   at the first temperature, laminating the circuit structure and the interposer substrate, so that a plurality of pads of the circuit structure are correspondingly connected to the first conductive connection material, and curing the first adhesive material layer.

17. The manufacturing method according to claim 10, wherein the step of bonding the circuit board onto the lower surface of the interposer substrate comprises:
   forming a solder mask on the lower surface of the interposer substrate, wherein the solder mask comprises a plurality of vias to expose a portion of the coaxial conductive element;
   forming a second conductive connection material in the vias; and
   correspondingly bonding the coaxial conductive element and a plurality of pads of the circuit board through the second conductive connection material.

18. The manufacturing method according to claim 17, wherein the second conductive connection material comprises a solder paste or a solder ball.

19. The manufacturing method according to claim 10, wherein the first temperature ranges from 180° C. to 220° C., and the second temperature ranges from 250° C. to 270° C.

* * * * *